(12) United States Patent
Jeong et al.

(10) Patent No.: US 12,366,971 B2
(45) Date of Patent: Jul. 22, 2025

(54) MEMORY DEVICE AND METHOD OF OPERATING THE SAME

(71) Applicant: SK hynix Inc., Icheon-si (KR)

(72) Inventors: Chan Hui Jeong, Icheon-si (KR); Dong Hun Kwak, Icheon-si (KR); Se Chun Park, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 217 days.

(21) Appl. No.: 18/076,029

(22) Filed: Dec. 6, 2022

(65) Prior Publication Data
US 2024/0028218 A1 Jan. 25, 2024

(30) Foreign Application Priority Data
Jul. 21, 2022 (KR) .......................... 10-2022-0090045

(51) Int. Cl.
G06F 3/06 (2006.01)

(52) U.S. Cl.
CPC .......... *G06F 3/0619* (2013.01); *G06F 3/0653* (2013.01); *G06F 3/0659* (2013.01); *G06F 3/0679* (2013.01)

(58) Field of Classification Search
CPC .... G06F 3/0619; G06F 3/0653; G06F 3/0659; G06F 3/0679; G11C 29/021; G11C 16/349; G11C 11/5671; G11C 16/08; G11C 16/32; G11C 29/023; G11C 29/028; G11C 16/26; G11C 16/0483; G11C 16/02
See application file for complete search history.

(56) References Cited

U.S. PATENT DOCUMENTS

| | | | |
|---|---|---|---|
| 2017/0133087 A1* | 5/2017 | Park | G11C 16/10 |
| 2020/0098436 A1 | 3/2020 | Kim et al. | |
| 2020/0152276 A1 | 5/2020 | Shin et al. | |
| 2020/0409788 A1* | 12/2020 | Kurose | G11C 16/0483 |
| 2021/0005268 A1* | 1/2021 | Kim | G11C 11/5671 |
| 2021/0158877 A1* | 5/2021 | Shin | G11C 16/32 |

FOREIGN PATENT DOCUMENTS

| | | |
|---|---|---|
| KR | 1020060107337 A | 10/2006 |
| KR | 1020180097854 A | 9/2018 |
| KR | 1020190140721 A | 12/2019 |

* cited by examiner

*Primary Examiner* — Mohammed A Bashar
(74) *Attorney, Agent, or Firm* — WILLIAM PARK & ASSOCIATES LTD.

(57) ABSTRACT

A memory device includes memory cells connected to a plurality of word lines. The memory device also includes a read operation performer configured to perform a read operation of applying an equalizing voltage to the plurality of word lines and applying a read voltage to a selected word line. The memory device further includes a fail cell counter configured to count a number of on cells among selected memory cells connected to the selected word line at each of time points. The memory device additionally includes a read operation controller configured to control the read operation performer to determine a length of an evaluation period based on a result of comparing the number of on cells at each of the time points, and configured to sense a voltage of bit lines respectively connected to the selected memory cells after the evaluation period elapses from the time.

20 Claims, 14 Drawing Sheets

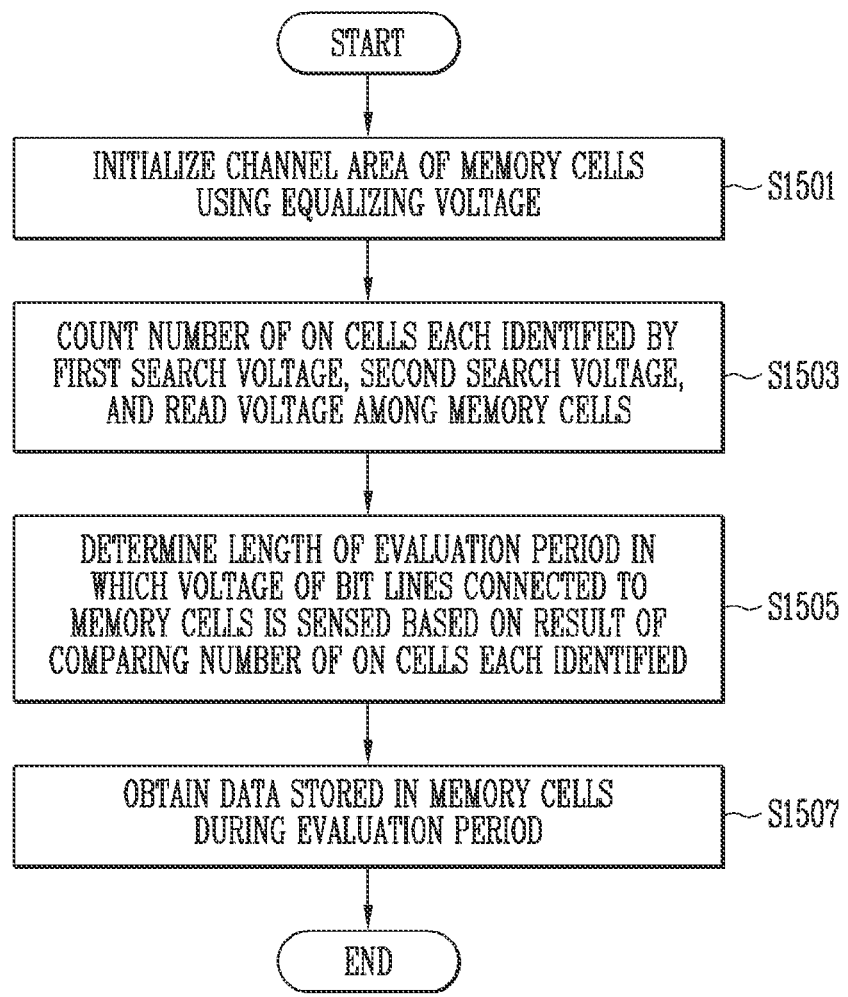

MEMORY DEVICE AND METHOD OF OPERATING THE SAME

CROSS-REFERENCE TO RELATED APPLICATION

The present application claims priority under 35 U.S.C. § 119(a) to Korean patent application number 10-2022-0090045, filed on Jul. 21, 2022, in the Korean Intellectual Property Office, the entire disclosure of which is incorporated herein by reference.

BACKGROUND

1. Technical Field

The present disclosure relates to an electronic device, and more particularly, to a memory device and a method of operating the same.

2. Related Art

A memory system is a device that stores data under the control of a host device such as a computer or a smartphone. The memory system may include a memory device, in which data is stored, and a memory controller, to control the memory device. The memory device is classified as a volatile memory device or a nonvolatile memory device.

A nonvolatile memory device is a device in which data is not lost even though power is cut off. Memory cells included in a nonvolatile memory device may store data. Each of the memory cells may have different threshold voltage distributions according to data to be stored. The threshold voltage distribution of the memory cells may change over time. After the threshold voltage distribution of the memory cells is changed, even when the data stored in the memory cells is read using the same read voltage as before, the threshold voltage distribution of the memory cells is changed. Because a large number of error bits may be included, reliability of the data obtained using the read voltage may be low. In order to accurately obtain the data stored in the memory cells, the read voltage may be changed or a timing of obtaining the data stored in the memory cells may be changed.

SUMMARY

An embodiment of the present disclosure provides a memory device and a method of operating the same capable of improving reliability of data read from the memory device.

According to an embodiment of the present disclosure, a memory device includes: memory cells connected to a plurality of word lines; a read operation performer configured to perform a read operation of applying an equalizing voltage to the plurality of word lines and applying a read voltage to a selected word line among the plurality of word lines; a fail cell counter configured to count a number of on cells among selected memory cells connected to the selected word line at each of a first time point when a predetermined time elapses from a time when the read voltage is applied, a second time point when the predetermined time elapses from the first time point, and a third time point when a voltage of the selected word line reaches the read voltage; and a read operation controller configured to control the read operation performer to determine a length of an evaluation period based on a result of comparing the number of on cells at the first time point, the second time point, and the third time point, and configured to sense a voltage of bit lines respectively connected to the selected memory cells after the evaluation period elapses from the time when the voltage of the selected word line reaches the read voltage during the read operation.

According to the present disclosure, a method of operating a memory device includes: performing a read operation of applying an equalizing voltage to a plurality of word lines and applying a read voltage to a selected word line among the plurality of word lines; counting a number of on cells among selected memory cells connected to the selected word line at each of a first time point when a voltage of the selected word line reaches a first search voltage lower than the equalizing voltage, a second time point when the voltage of the selected word line reaches a second search voltage lower than the first search voltage, and a third time point when the voltage of the selected word line reaches the read voltage higher than the second search voltage; and determining a length of an evaluation period based on a result of comparing the number of on cells at the first time point, the second time point, and the third time point, and sensing a voltage of bit lines respectively connected to the selected memory cells after the evaluation period elapses from the time when the voltage of the selected word line reaches the read voltage.

According to an embodiment of the present disclosure, a memory device includes: memory cells connected to a plurality of word lines; a read operation performer configured to perform a read operation of applying an equalizing voltage to the plurality of word lines and applying a first search voltage less than the equalizing voltage, a second search voltage less than the first search voltage, and a read voltage greater than the second search voltage to a selected word line among the plurality of word lines; a fail cell counter configured to count a number of on cells each identified by the first search voltage, the second search voltage, and the read voltage among selected memory cells connected to the selected word line; and a read operation controller configured to control the read operation performer to sense a voltage of bit lines respectively connected to the selected memory cells after an evaluation period determined according to a result of comparing the number of each identified on cells elapses from a time when a voltage of the selected word line reaches the read voltage during the read operation.

BRIEF DESCRIPTION OF THE DRAWINGS

FIG. 15 is a flowchart illustrating the read operation of the memory device.

DETAILED DESCRIPTION

Specific structural or functional descriptions of embodiments which are disclosed in the present specification or application are illustrated only to describe the embodiments according to the concept of the present disclosure. The embodiments according to the concept of the present disclosure may be carried out in various forms and should not be construed as being limited to the embodiments described in the present specification or application, FIG. 1 is a diagram illustrating a memory system including a memory device according to an embodiment of the present disclosure.

Figure 1:
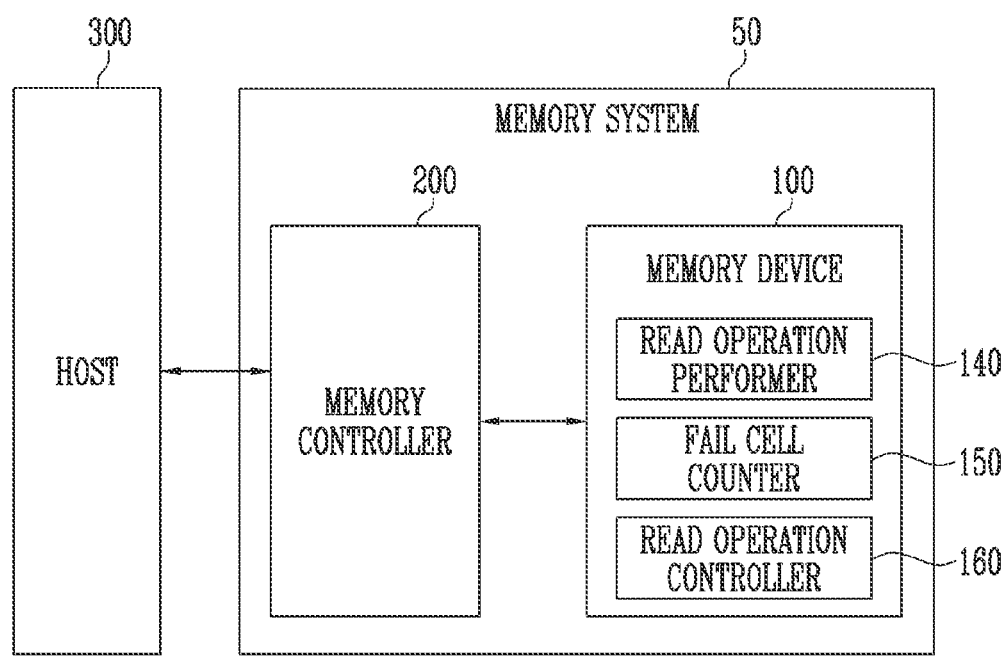
FIG. 1 is a diagram illustrating a memory system including a memory device according to an embodiment of the present disclosure.

Referring to FIG. 1, the memory system 50 may include a memory device 100 and a memory controller 200. The memory system 50 may be a device that stores data under the control of a host 300 such as a cellular phone, a smartphone, an MP3 player, a laptop computer, a desktop computer, a game player, a TV, a tablet PC, or an in-vehicle infotainment system.

The memory system 50 may be manufactured as one of various types of storage devices according to a host interface that is a communication method with the host 300. For example, the memory system 50 may be configured as any one of various types of storage devices such as an SSD, a multimedia card in a form of an MMC, an eMMC, an RS-MMC and a micro-MMC, a secure digital card in a form of an SD, a mini-SD and a micro-SD, a universal serial bus (USB) storage device, a universal flash storage (UFS) device, a personal computer memory card international association (PCMCIA) card type storage device, a peripheral component interconnection (PCI) card type storage device, a PCI express (PCI-E) card type storage device, a compact flash (CF) card, a smart media card, and a memory stick.

The memory system 50 may be manufactured as any one of various types of packages. For example, the memory system 50 may be manufactured as any one of various types of package types, such as a package on package (POP), a system in package (SIP), a system on chip (SOC), a multi-chip package (MCP), a chip on board (COB), a wafer-level fabricated package (WFP), and a wafer-level stack package (WSP).

The memory device 100 may store data. The memory device 100 operates under the control of the memory controller 200. The memory device 100 may include a memory cell array (not shown) including a plurality of memory cells that store data.

The memory cell array (not shown) may include a plurality of memory blocks. Each memory block may include a plurality of memory cells. One memory block may include a plurality of pages. In an embodiment, a page may be a unit for storing data in the memory device 100 or reading data stored in the memory device 100. A memory block may be a unit for erasing data.

In an embodiment, the memory device 100 may utilize double data rate synchronous dynamic random access memory (DDR SDRAM), low power double data rate4 (LPDDR4) SDRAM, graphics double data rate (DDDR) SDRAM, low power DDR (LPDDR), Rambus dynamic random access memory (RDRAM), NAND flash memory, vertical NAND flash memory, NOR flash memory, resistive random access memory (RRAM), phase-change random access memory (PRAM), magnetoresistive random access memory (MRAM), ferroelectric random access memory (FRAM), spin transfer torque random access memory (STT-RAM) or the like. In the present specification, for convenience of description, it is assumed that the memory device 100 uses NAND flash memory.

The memory device 100 is configured to receive a command and an address from the memory controller 200 and access an area selected by the address in the memory cell array. The memory device 100 may perform an operation instructed by the command on the area selected by the address. For example, the memory device 100 may perform a write operation (program operation), a read operation, and an erase operation. The memory device 100 may program, read, or erase data in the area selected by the address.

In an embodiment, the memory device 100 may include a read operation performer 140, a fail cell counter 150, and a read operation controller 160. In some embodiments, the read operation performer 140, the fail cell counter 150, and/or the read operation controller 160 may be a read operation performer circuit, a fail cell counter circuit, and/or a read operation controller circuit.

The read operation performer 140 may perform the read operation on the memory cells. The read operation may be an operation of obtaining data stored in the memory cells. The read operation may be an operation of applying a read voltage to the memory cells in which data is stored, and sensing the data stored in the memory cells in a state in which the read voltage is applied. Because a threshold voltage of the memory cells is determined according to the stored data, the read operation may be an operation of identifying in which state the threshold voltage of each of the memory cells is. For example, when each of the memory cells are programmed in a triple-level cell (TLC) that stores three bits of data, seven read voltages may be applied to a word line connected to the memory cells in order to identify to which state the threshold voltage of the memory cells corresponds among an erase state and first to seventh program states.

The fail cell counter 150 may count the number of memory cells having a threshold voltage less than a voltage applied to the word line connected to the memory cells among the memory cells. For example, when the read voltage is applied to the word line, the fail cell counter 150 may count the number of memory cells having a threshold voltage less than the read voltage among the memory cells. As another example, the fail cell counter 150 may count the number of memory cells having a threshold voltage less than a first search voltage greater than the read voltage among the memory cells. As still another example, the fail cell counter 150 may count the number of memory cells having a threshold voltage less than a second search voltage less than the read voltage among the memory cells. Among the memory cells, the memory cell having the threshold voltage less than the voltage applied to the word line connected to the memory cells may be identified as an on cell. Among the memory cells, a memory cell having a threshold voltage greater than the voltage applied to the word line connected to the memory cells may be identified as an off cell.

The read operation controller 160 may control the read operation performed by the read operation performer 140. In addition, the read operation controller 160 may compare the number of memory cells counted by the fail cell counter 150. The read operation controller 160 may determine a length of an evaluation period included in the read operation based on a result of comparing the number of memory cells. The evaluation period may be a period in which a voltage of the bit line is changed according to the threshold voltage of the memory cells when the read voltage is applied to the word line. The read operation controller 160 may control the read operation performer 140 to sense the voltage of the bit line after the evaluation period elapses during the read operation. The read operation controller 160 may control the read operation performer 140 to obtain the data stored in the memory cells based on a result of comparing the voltage of the bit line with a reference voltage after the evaluation period elapses during the read operation.

The memory controller 200 may control an overall operation of the memory system 50.

When power is applied to the memory system 50, the memory controller 200 may execute firmware (FW). In an embodiment, the memory controller 200 may execute firmware to control communication between the host 300 and the memory device 100. In an embodiment, the memory controller 200 may convert a logical block address of the host into a physical block address of the memory device.

The memory controller 200 may control the memory device 100 to perform the write operation, the read operation, the erase operation, or the like according to a request of the host 300. The memory controller 200 may provide a command, a physical block address, or data to the memory device 100 according to the write operation, the read operation, and the erase operation.

In an embodiment, the memory controller 200 may generate a command, an address, and data independently regardless of the request from the host 300 and transmit the command, the address, and the data to the memory device 100.

For example, the memory controller 200 may provide the command, the address, and the data for performing the read operation and the write operations accompanying in performing wear leveling, read reclaim, garbage collection, and the like, to the memory device 100.

In an embodiment, the memory controller 200 may control at least two or more memory devices 100. In this case, the memory controller 200 may control the memory devices 100 according to an interleaving method to improve operation performance. The interleaving method may be a method of controlling operations for at least two memory devices 100 to overlap with each other.

The host 300 may communicate with the memory system 50 using at least one of various communication methods such as a universal serial bus (USB), a serial AT attachment (SATA), a serial attached SCSI (SAS), a high speed interchip (HSIC), a small computer system interface (SCSI), a peripheral component interconnection (PCI), a PCI express (PCIe), a nonvolatile memory express (NVMe), a universal flash storage (UFS), a secure digital (SD), a multi-media card (MMC), an embedded MMC (eMMC), a dual in-line memory module (DIMM), a registered DIMM (RDIMM), and a load reduced DIMM (LRDIMM).

In an embodiment, the memory system 50 may include a buffer memory (not shown). For example, the buffer memory may temporarily store data received from the host 300 or data received from the memory device 100, or may temporarily store meta data (for example, a mapping table) of the memory device 100. The buffer memory may include volatile memory such as DRAM, SDRAM, DDR SDRAM, LPDDR SDRAM, GRAM, or nonvolatile memory such as FRAM, ReRAM, STT-MRAM, and PRAM.

Figure 2:
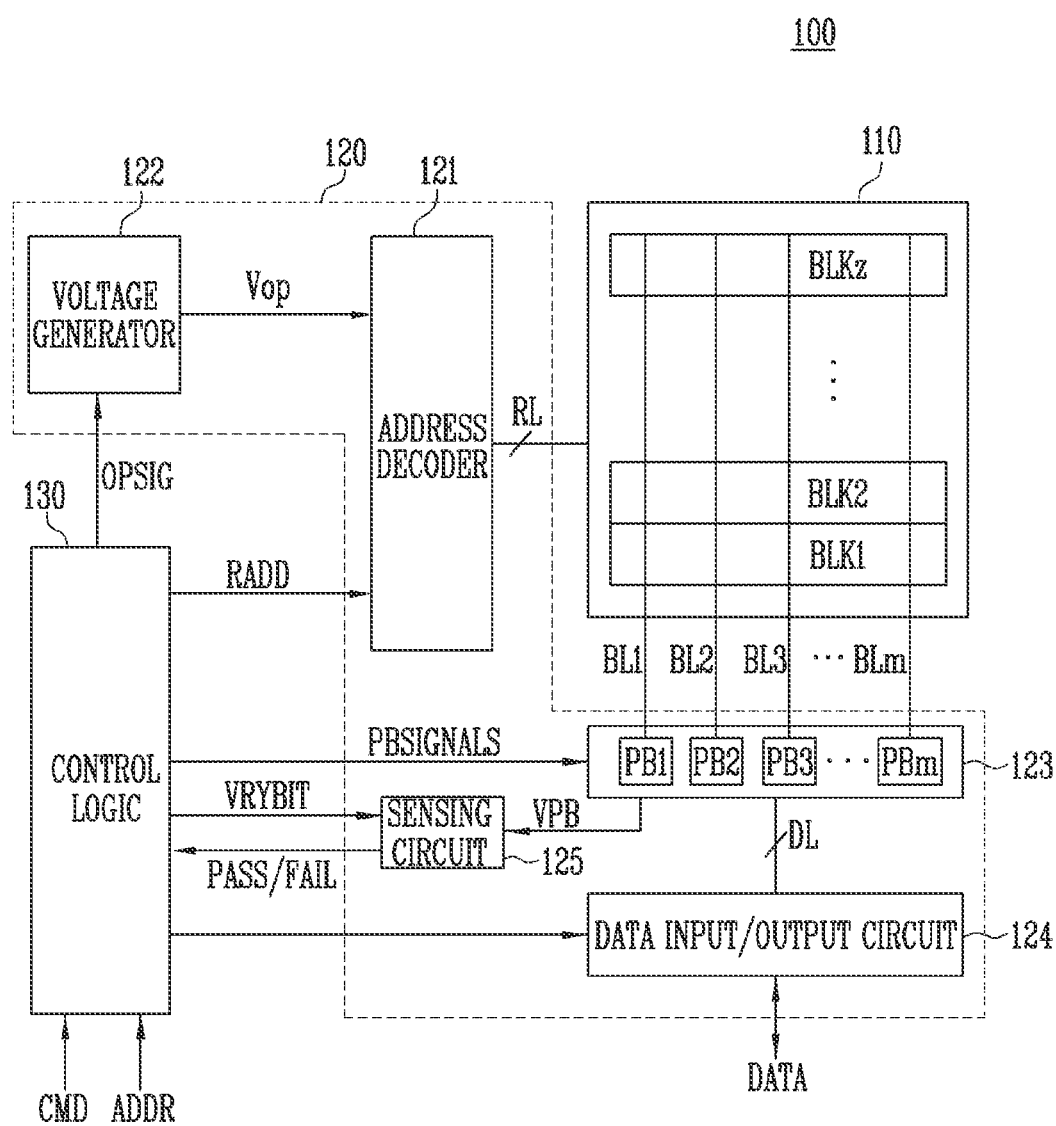
FIG. 2 is a diagram illustrating a structure of the memory device of FIG. 1.

FIG. 2 is a diagram illustrating a structure of the memory device of FIG. 1.

Referring to FIG. 2, the memory device 100 may include a memory cell array 110, a peripheral circuit 120, and control logic 130.

The memory cell array 110 includes a plurality of memory blocks BLK1 to BLKz. The plurality of memory blocks BLK1 to BLKz are connected to an address decoder 121 through row lines RL. The plurality of memory blocks BLK1 to BLKz are connected to a page buffer group 123 through bit lines BL1 to BLm. Each of the plurality of memory blocks BLK1 to BLKz includes a plurality of memory cells. In an embodiment, the plurality of memory cells are non-volatile memory cells. Memory cells connected to the same word line among the plurality of memory cells are defined as one page. That is, the memory cell array 110 is configured of a plurality of pages. According to an embodiment of the present disclosure, each of the plurality of memory blocks BLK1 to BLKz included in the memory cell array 110 may include a plurality of dummy cells. At least one of the dummy cells may be connected in series between a drain select transistor and the memory cells and between a source select transistor and the memory cells.

Each of the memory cells of the memory device 100 may be configured as a single-level cell (SLC) that stores one bit of data, a multi-level cell (MLC) that stores two bits of data, a triple-level cell (TLC) that stores three bits of data, a quad-level cell (CLC) capable of storing four bits of data, or memory cells capable of storing five or more hits of data.

The peripheral circuit 120 drives the memory cell array 110. For example, the peripheral circuit 120 may drive the memory cell array 110 to perform the program operation, the read operation, and the erase operation. As another example, the peripheral circuit 120 may apply various operations voltages to the row lines RL and the bit lines BL1 to BLm or discharge the applied voltages according to control of the control logic 130.

The peripheral circuit 120 may include an address decoder 121, a voltage generator 122, the page buffer group 123, a data input/output circuit 124, and a sensing circuit 125.

The address decoder 121 is connected to the memory cell array 110 through the row lines RL. The row lines RL may include drain select lines, word lines, source select lines, and a common source line. According to an embodiment of the present disclosure, the word lines may include normal word lines and dummy word lines. According to an embodiment of the present disclosure, the row lines RL may further include a pipe select line.

The address decoder 121 is configured to operate in response to the control of the control logic 130. The address decoder 121 receives an address RADD from the control logic 130.

The address decoder 121 is configured to decode a block address of the received address RADD. The address decoder 121 selects at least one memory block among the memory blocks BLK1 to BLKz according to the decoded block address. The address decoder 121 is configured to decode a row address of the received address RADD. The address decoder 121 may select at least one word line of the selected memory block by applying voltages provided from the voltage generator 122 to at least one word line WL according to the decoded row address.

During the program operation, the address decoder 121 may apply a program voltage to a selected word line and apply a pass voltage having a level less than that of the program voltage to unselected word lines. During a program verify operation, the address decoder 121 may apply a verify voltage to the selected word line and apply a verify pass voltage having a level greater than that of the verify voltage to the unselected word lines.

During the read operation, the address decoder 121 may apply a read voltage to the selected word line and apply a read pass voltage having a level greater than that of the read voltage to the unselected word lines.

The erase operation of the memory device 100 is performed in a memory block unit. The address RADD input to the memory device 100 during the erase operation includes a block address. The address decoder 121 may decode the block address and select one memory block according to the decoded block address. During the erase operation, the address decoder 121 may apply a ground voltage to the word lines connected to the selected memory block.

The address decoder 121 may be configured to decode a column address of the transmitted address RADD. The decoded column address may be transmitted to the page buffer group 123. As an example, the address decoder 121 may include a component such as a row decoder, a column decoder, and an address buffer.

The voltage generator 122 is configured to generate a plurality of operation voltages Vop by using an external power voltage supplied to the memory device 100. The voltage generator 122 operates in response to the control of the control logic 130.

In an embodiment, the voltage generator 122 may generate an internal power voltage by regulating the external power voltage. The internal power voltage generated by the voltage generator 122 is used as an operation voltage of the memory device 100.

In an embodiment, the voltage generator 122 may generate the various operation voltages Vop used for the program, read, and erase operations in response to an operation signal OPSIG. The voltage generator 122 may generate the plurality of operation voltages Vop using the external power voltage or the internal power voltage. The voltage generator 122 may be configured to generate various voltages required by the memory device 100. For example, the voltage generator 122 may generate a plurality of erase voltages, a plurality of program voltages, a plurality of pass voltages, a plurality of selection read voltages, and a plurality of non-selection read voltages.

In order to generate the plurality of operation voltages Vop having various voltage levels, the voltage generator 122 may include a plurality of pumping capacitors that receive the internal voltage and selectively activate the plurality of pumping capacitors in response to the control logic 130 to generate the plurality of operation voltages Vop.

The plurality of generated operation voltages Vop may be supplied to the memory cell array 110 by the address decoder 121.

The page buffer group 123 includes first to m-th page buffers PB1 to PBm. The first to m-th page buffers PB1 to PBm are connected to the memory cell array 110 through first to m-th bit lines BL1 to BLm, respectively. The first to m-th page buffers PB1 to PBm operate in response to the control of the control logic 130.

The first to m-th page buffers PB1 to PBm communicate data DATA with the data input/output circuit 124. At a time of program, the first to m-th page buffers PB1 to PBm receive the data DATA to be stored through the data input/output circuit 124 and data lines DL.

During the program operation, the first to m-th page buffers PB1 to PBm may transmit the data DATA received from the data input/output circuit 124 to the selected memory cells through the bit lines BL1 to BLm. The memory cells of the selected page are programmed according to the transmitted data DATA. A memory cell connected to a bit lire to which a program allowable voltage (for example, a ground voltage) is applied may have an increased threshold voltage. A threshold voltage of a memory cell connected to a bit line to which a program inhibit voltage (for example, a power voltage) is applied may be maintained. During the program verify operation, the first to m-th page buffers PB1 to PBm read the data DATA stored in the memory cells from the selected memory cells through the bit lines BL1 to BLm.

During the read operation, the page buffer group 123 may read the data DATA from the memory cells of the selected page through the bit lines BL and store the read data DATA in the first to m-th page buffers PB1 to PBm.

During the erase operation, the page buffer group 123 may float the bit lines BL. In an embodiment, the page buffer group 123 may include a column selection circuit.

The data input/output circuit 124 is connected to the first to m-th page buffers PB1 to PBm through the data lines DL. The data input/output circuit 124 operates in response to the control of the control logic 130.

The data input/output circuit 124 may include a plurality of input/output buffers (not shown) that receive the input data DATA. During the program operation, the data input/output circuit 124 may receive the data DATA to be stored from an external controller (not shown). During the read operation, the data input/output circuit 124 may output the data DATA transmitted from the first to m-th page buffers PB1 to PBm included in the page buffer group 123 to the external controller. For example, the data input/output circuit 124 may output the data DATA transmitted from the first to m-th page buffers PB1 to PBm to the external controller in response to a data output control signal received from the control logic 130

During the read operation or the verify operation, the sensing circuit 125 may generate a reference current in response to a signal of an allowable bit VRYBIT generated by the control logic 130 and may compare a sensing voltage VPB received from the page buffer group 123 with a reference voltage generated by the reference current to output a pass signal or a fail signal to the control logic 130.

In an embodiment, the sensing circuit 125 may compare the sensing voltage VPB received from the page buffer group 123 with a reference voltage to identify whether a memory cell connected to the bit line is an on cell or an off cell. For example, the sensing circuit 125 may identify a memory cell connected to the bit line as an on cell when the sensing voltage VPB is less than the reference voltage. As another example, the sensing circuit 125 may identify a memory cell connected to the bit line as an off cell when the sensing voltage VPB is greater than the reference voltage. In an embodiment, the sensing circuit 125 may count the number of on cells having a threshold voltage less than the read voltage or the verify voltage during the read operation or the verify operation among the memory cells.

The control logic 130 may be connected to the address decoder 121, the voltage generator 122, the page buffer group 123, the data input/output circuit 124, and the sensing circuit 125. The control logic 130 may be configured to control all operations of the memory device 100. The control logic 130 play operate in response to a command CMD transmitted from an external device. The control logic 130 may be implemented as hardware, software, or a combination of hardware and software. For example, the control logic 130 may be a control logic circuit operating in accordance with an algorithm and/or a processor executing control logic code.

The control logic 130 may generate various signals in response to the command CMD and the address ADDR to control the peripheral circuit 120. For example, the control logic 130 may generate the operation signal OPSIG, the address RADD, a page buffer control signal PBSIGNALS, and the allowable bit VRYBIT in response to the command CMD and the address ADDR. The control logic 130 may output the operation signal OPSIG to the voltage generator 122, output the address RADD to the address decoder 121, output the page buffer control signal to the page buffer group 123, and output the allowable bit VRYBIT to the sensing circuit 125. In an embodiment, the control logic 130 may control to transmit data stored in the first to m-th page buffers PB1 to PBm to the data input/output circuit 124 through the page buffer control signal PBSIGNALS.

In an embodiment, the read operation performer 140 shown in FIG. 1 may include the memory cell array 110, the voltage generator 122, the address decoder 121, and the page buffer group 123. The read operation performer 140 may generate voltages used for the read operation under the control of the read operation controller 160 and apply the voltages to the word line and the bit line. The read operation performer 140 may sense a voltage of the bit line under the control of the read operation controller 160.

In an embodiment, the fail cell counter 150 shown in FIG. 1 may include the sensing circuit 125. The fail cell counter 150 may count the number of memory cells having a threshold voltage less than the voltage applied to the word line among the memory cells.

In an embodiment, the read operation controller 160 shown in FIG. 1 may be included in the control logic 130. The read operation controller 160 may determine the length of the evaluation period based on a result of counting the number of memory cells during the read operation. The read operation controller 160 may control the read operation performer 140 to sense the voltage of the bit line after the evaluation period elapses during the read operation.

Figure 3:
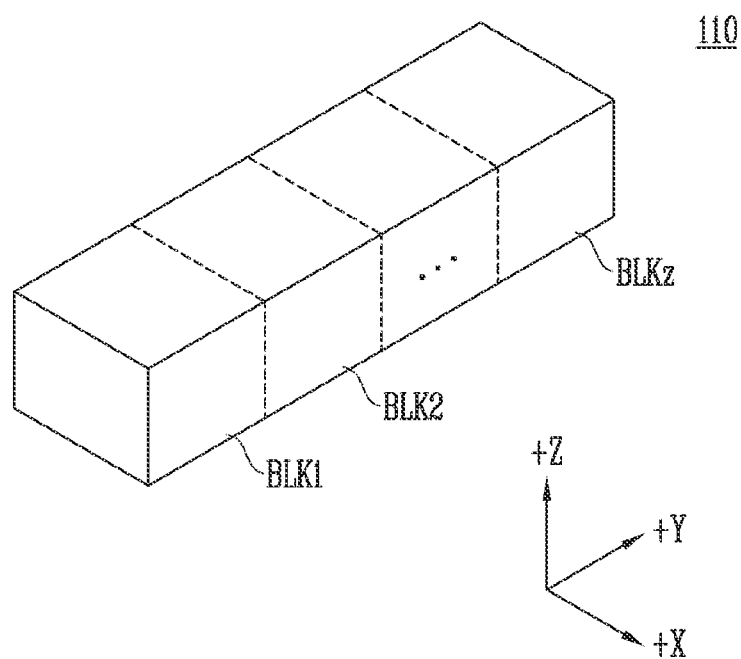
FIG. 3 is a diagram illustrating an embodiment of a memory cell array of FIG. 2.

FIG. 3 is a diagram Illustrating an embodiment of the memory cell array of FIG. 2.

Referring to FIG. 3, the memory cell array 110 includes a plurality of memory blocks BLK1 to BLKz. Each memory block may have a three-dimensional structure. Each memory block includes a plurality of memory cells stacked on a substrate. Such plurality of memory cells are arranged along a +X direction, a +Y direction, and a +Z direction. A structure of each memory block is described in more detail with reference to FIGS. 4, 5, and 6.

Figure 4:
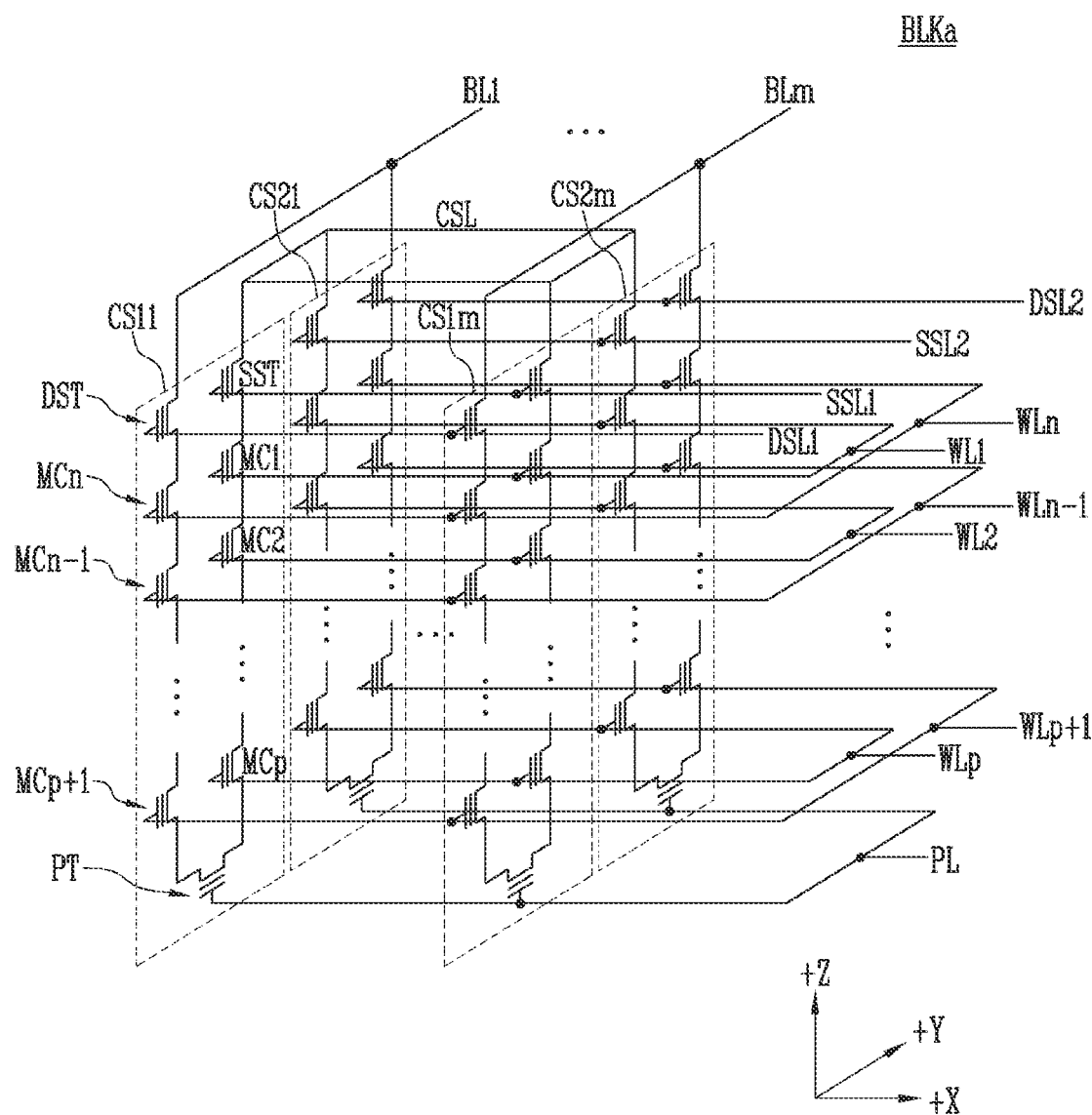
FIG. 4 is a circuit diagram illustrating any one memory block BLKa among memory blocks BLK1 to BLKz of FIG. 3.

FIG. 4 is a circuit diagram illustrating any one memory block BLKa among the memory blocks BLK1 to BLKz of FIG. 3.

Referring to FIG. 4, the memory block BLKa includes a plurality of cell strings CS11 to CS1m and CS21 to CS2m. In an embodiment, each of the plurality of cell strings CS11 to CS1m and CS21 to CS2m may be formed in a 'U' shape. In the memory block BLKa, m cell strings are arranged in a row direction (that is, the +X direction). In FIG. 4, two cell strings are arranged in a column direction (that is, the +Y direction). However, this is for convenience of description, and it may be understood that three or more cell strings may be arranged in the column direction.

Each of the plurality of cell strings CS11 to CS1m and CS21 to CS2m includes at least one source select transistor SST, first to n-th memory cells MC1 to MCn, a pipe transistor PT, and at least one drain select transistor DST.

Each of the select transistors SST and DST and the memory cells MC1 to MCn may have a similar structure. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each cell string. In an embodiment, a pillar for providing at least one of the channel layer, the tunneling insulating layer, the charge storage layer, and the blocking insulating layer may be provided in each cell string.

The source select transistor SST of each cell string is connected between a common source line CSL and the memory cells MC1 to MCp.

In an embodiment, the source select transistors of the cell strings arranged in the same row are connected to a source select line extending in the row direction, and the source select transistors of the cell strings arranged in different rows are connected to different source select lines. In FIG. 4, the source select transistors of the cell strings CS11 to CS1m of a first row are connected to a first source select line SSL1. The source select transistors of the cell strings CS21 to CS2m of a second row are connected to a second source select line SSL2.

In another embodiment, the source select transistors of the cell strings CS11 to CS1m and CS21 to CS2m may be commonly connected to one source select line.

The first to n-th memory cells MC1 to MCn of each cell string are connected between the source select transistor SST and the drain select transistor DST.

The first to n-th memory cells MC1 to MCn may be divided into first to p-th memory cells MC1 to MCp and (p+1)-th to n-th memory cells MCp+1 to MCn. The first to p-th memory cells MC1 to MCp are sequentially arranged in a direction opposite to the +Z direction, and are connected in series between the source select transistor SST and the pipe transistor PT. The (p+1)-th to n-th memory cells MCp+1 to MCn are sequentially arranged in the +Z direction and are connected in series between the pipe transistor PT and the drain select transistor DST. The first to p-th memory cells MC1 to MCp and the (p+1)-th to n-th memory cells MCp+1 to MCn are connected to each other through the pipe transistor PT. Gates of the first to n-th memory cells MC1 to MCn of each cell string are connected to the first to n-th word lines WL1 to WLn, respectively.

A gate of the pipe transistor PT of each cell string is connected to a pipeline PL.

The drain select transistor DST of each cell string is connected between a corresponding bit line and the memory cells MCp+1 to MCn. Cell strings arranged in the row direction are connected to the drain select line extending in the row direction. The drain select transistors of the cell strings CS11 to CS1m of the first row are connected to a first drain select line DSL1. The drain select transistors of the cell strings CS21 to CS2m of the second row are connected to a second drain select line DSL2.

The cell strings arranged in the column direction are connected to the bit lines extending in the column direction. In FIG. 4, the cell strings CS11 and CS21 of the first column are connected to the first bit line BL1. The cell strings CS1m and CS2m of the m-th column are connected to the m-th bit line BLm.

The memory cells connected to the same word line in the cell strings arranged in the row direction configure one page. For example, the memory cells connected to the first word line WL1, among the cell strings CS11 to CS1m of the first row configure one page. The memory cells connected to the first word line WL1, among the cell strings CS21 to CS2m of the second row configure another page. The cell strings arranged in one row direction may be selected by selecting any one of the drain select lines DSL1 and DSL2. One page of the selected cell strings may be selected by selecting any one of the word lines WL1 to WLn.

In another embodiment, even bit lines and odd bit lines may be provided instead of the first to m-th bit lines BL1 to BLm. In addition, even-numbered cell strings among the cell strings CS11 to CS1m or CS21 to SC2m arranged in the row direction may be connected to even bit lines, and odd-numbered cell strings among the cell strings CS11 to CS1m or CS21 to CS2m arranged in the row direction may be connected to odd bit lines, respectively.

In an embodiment, at least one of the first to n-th memory cells MC1 to MCn may be used as a dummy memory cell. For example, at least one dummy memory cell is provided to reduce an electric field between the source select transistor SST and the memory cells MC1 to MCp. Alternatively, at least one dummy memory cell is provided to reduce an electric field between the drain select transistor DST and the memory cells MCp+1 to MCn.

Figure 5:
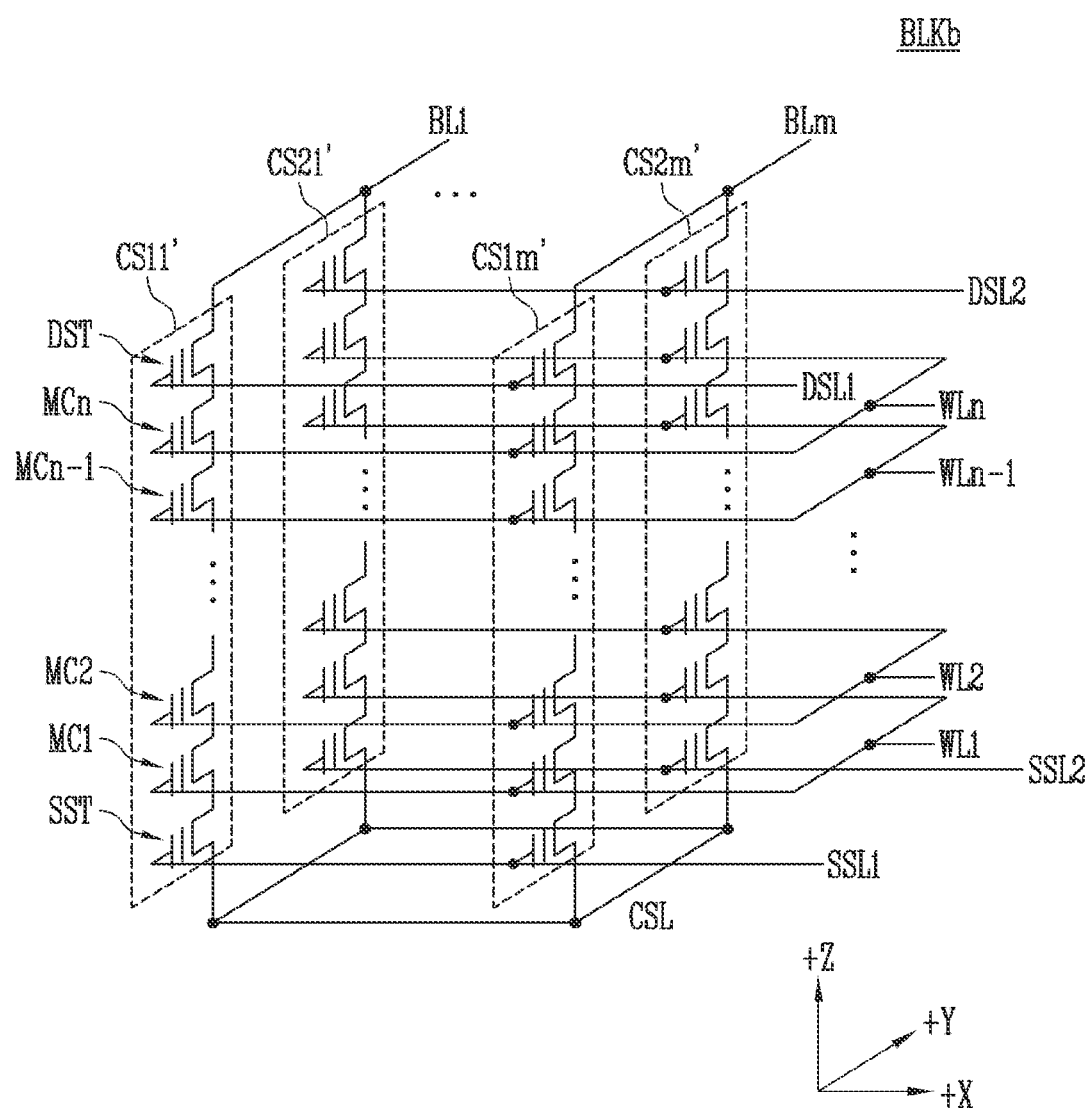
FIG. 5 is a circuit diagram illustrating another embodiment of any one memory block BLKb among the memory blocks BLK1 to BLKz of FIG. 3.

FIG. 5 is a circuit diagram illustrating another embodiment of any one memory block BLKb among the memory blocks BLK1 to BLKz of FIG. 3.

Referring to FIG. 5, the memory block BLKb includes a plurality of cell strings CS11' to CS1m' and CS21' to CS2m'. Each of the plurality of cell strings CS11' to CS1m' and CS21' to CS2m' extends along a +Z direction. Each of the plurality of cell strings CS11' to CS1m' and CS21' to CS2m' includes at least one source select transistor SST, first to n-th memory cells MC1 to MCn, and at least one drain select transistor DST stacked on a substrate (not shown) under the memory block BLKb.

The source select transistor SST of each cell string is connected between a common source line CSL and memory cells MC1 to MCn. The source select transistors of the cell strings arranged in the same row are connected to the same source select line. The source select transistors of the cell strings CS11' to CS1m' arranged in a first row are connected to a first source select line SSL1. The source select transistors of the cell strings CS21' to CS2m' arranged in a second row are connected to a second source select line SSL2. In another embodiment, the source select transistors of the cell strings CS11' to CS1m' and CS21' to CS2m' may be commonly connected to one source select line.

The memory block BLKb shown in FIG. 5 has an equivalent circuit similar to that of the memory block BLKa of FIG. 4 except that the pipe transistor PT is excluded from each cell string.

Figure 6:
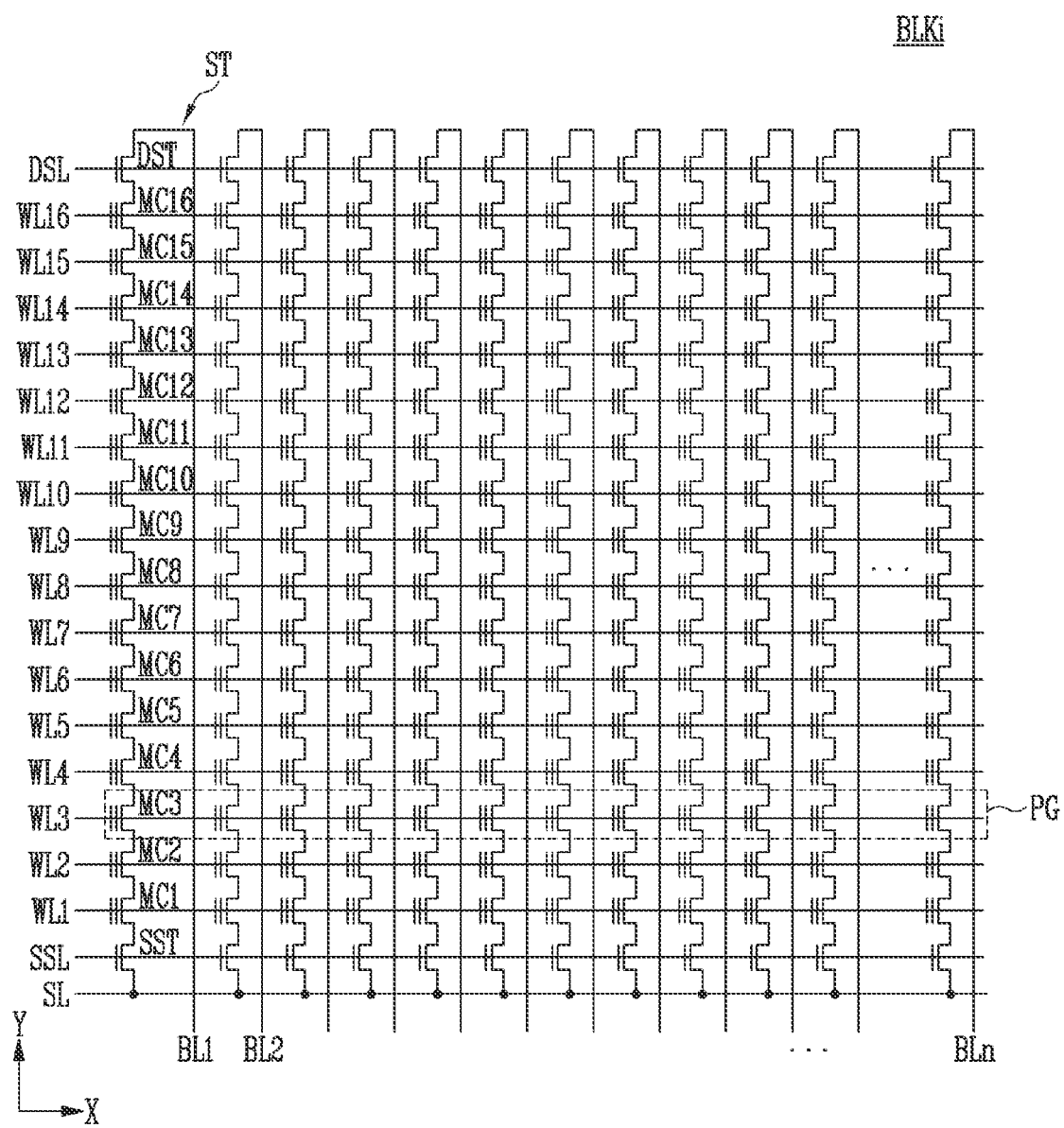
FIG. 6 is a circuit diagram illustrating still another embodiment of any one memory block BLKi among the memory blocks BLK1 to BLKz of FIG. 3.

FIG. 6 is a circuit diagram illustrating still another embodiment of any one memory block BLKi among the memory blocks BLK1 to BLKz of FIG. 3.

Referring to FIG. 6, a plurality of word lines may be arranged in parallel with each other between a first select line and a second select line. Here, the first select line may be a source select line SSL, and the second select line may be a drain select line DSL. More specifically, the memory block BLKi may include a plurality of strings ST connected between the bit lines BL1 to BLn and a common source line SL. The bit lines BL1 to BLn may be connected to the strings ST, respectively, and the common source line SL may be commonly connected to the strings ST. Because the strings ST may be configured identically to each other, a string ST connected to the first bit line BL1 is specifically described as an example.

The string ST nay include a source select transistor SST, a plurality of memory cells MC1 to MC16, and a drain select transistor DST connected in series between the common source line SL and the first bit line BL1. One string ST may include at least one or more of the source select transistor SST and the drain select transistor DST.

A source of the source select transistor SST may be connected to the common source line SL and a drain of the drain select transistor DST may be connected to the first bit line BL1. The plurality of memory cells MC1 to MC16 may be connected in series between the source select transistor SST and the drain select transistor DST. Gates of the source select transistors SST included in the different strings ST may be connected to the source select line SSL, gates of the drain select transistors DST may be connected to the drain select line DSL, and gates of the memory cells MC1 to MC16 may be connected to the plurality of word lines WL1 to WL16. A group of the memory cells connected to the same word line among the memory cells included in different strings ST may be referred to as a physical page PG. Therefore, the memory block BLKi may include the physical pages PG of the number of the plurality of word lines WL1 to WL16.

One memory cell may store one bit of data. This is commonly referred to as the SLC. In this case, one physical page PG may store one logical page (LPG) data. One logical page (LPG) data may include data bits of the number of cells included in one physical page PG.

One memory cell may store two or more bits of data. In this case, one physical page PG may store two or more logical page (LPG) data. In an embodiment, when the memory cells store three bits of data, data stored in one physical page may include three logical pages. Specifically, the three logical pages may include a least significant bit (LSB) page, a central significant bit (CSB) page, and a most significant bit (MSB) page.

Figure 7:
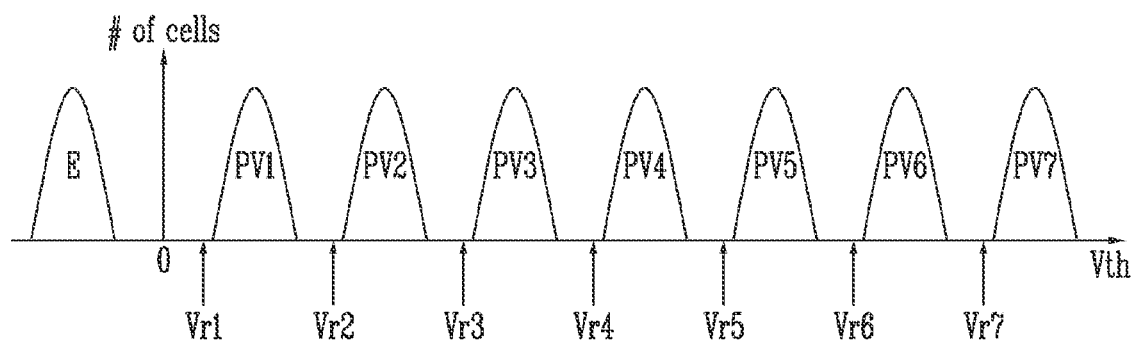
FIG. 7 is a diagram illustrating a threshold voltage distribution of memory cells.

FIG. 7 is a diagram illustrating a threshold voltage distribution of the memory cells.

In FIG. 7, a horizontal axis of a graph indicates a threshold voltage Vth of the memory cells, and a vertical axis of the graph indicates the number of memory cells # of cells.

In FIG. 7, it is assumed that one memory cell is programmed in the TLC that stores three bits of data. Referring to FIG. 7, the threshold voltage of the memory cells may be increased to a threshold voltage corresponding to any one of an erase state E and first to seventh program states PV1 to PV7 by the program operation. The data stored in the memory cells may vary according to a program state of the memory cells. The memory cells may respectively store different data according to which state threshold voltage of the memory cells correspond to among the erase state E and the first to seventh program states PV1 to PV7.

The memory device 100 may perform the read operation of obtaining the data stored in the memory cells. Specifically, the memory device 100 may sense the voltage of the bit lines connected to the memory cells that are changed when the read voltage is applied to the word line connected to the memory cells, and compare the sensed voltage with the reference voltage to obtain the data stored in the memory cells.

In an embodiment, the memory device 100 may perform the read operation on a plurality of logical pages using a plurality of read voltages. The plurality of logical pages may include the LSB page, the CSB page, and the MSB page. The plurality of read voltages may include first to seventh read voltages Vr1 to Vr7. Each of the first to seventh read voltages Vr1 to Vr7 may be a voltage that distinguishes each of the erase state E and the first to seventh program states PV1 to PV7. For example, the memory device 100 may perform the read operation on the CSB page using the third read voltage Vr3 that distinguishes the erase state E, the first and second program states PV1 to PV2, and the third to seventh program state PV3 to PV7, and the seventh read voltage Vr7 that distinguishes the erase state E, the first to sixth program states PV1 to PV6, and the seventh program state PV7.

Figure 8:
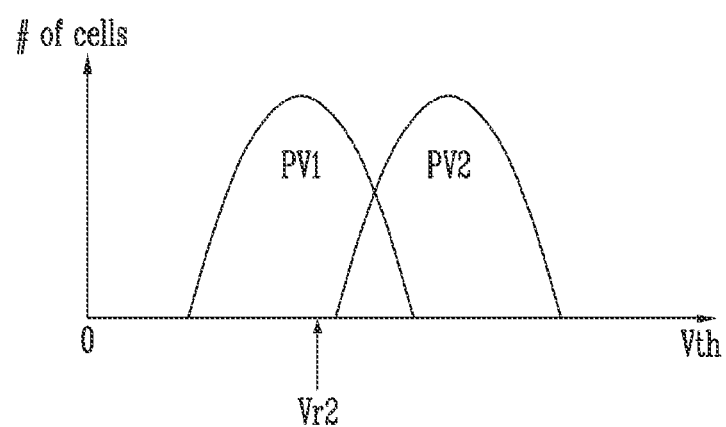
FIG. 8 is a diagram illustrating a changed threshold voltage distribution of the memory cells.

FIG. 8 is a diagram illustrating a changed threshold voltage distribution of the memory cells.

In FIG. 8, a case of cells programmed with a threshold voltage corresponding to the first and second program states PV1 to PV2 among programmed memory cells is described as an example. The threshold voltage distribution of the memory cells having the threshold voltage corresponding to the first and second program states PV1 to PV2 shown in FIG. 7 may change to the threshold voltage distribution of the memory cells having the threshold voltage corresponding to the first and second program states PV1 to PV2 shown in FIG. 8 as a time elapses. For example, the threshold voltage distribution of the memory cells may change to the threshold voltage distribution of the memory cells shown in FIG. 8 as the number of times the program and erase operations are performed on the memory cells increases. Accordingly, when the data stored in the memory cells is read using the second read voltage Vr2 that distinguishes the first program state PV1 and the second program state PV2 of FIG. 7, a large number of fail bits may be included. Accordingly, the read voltage that distinguishes the first program state PV1 and the second program state PV2 may be required to be changed to a read voltage of another magnitude other than the second read voltage Vr2.

Figure 9:
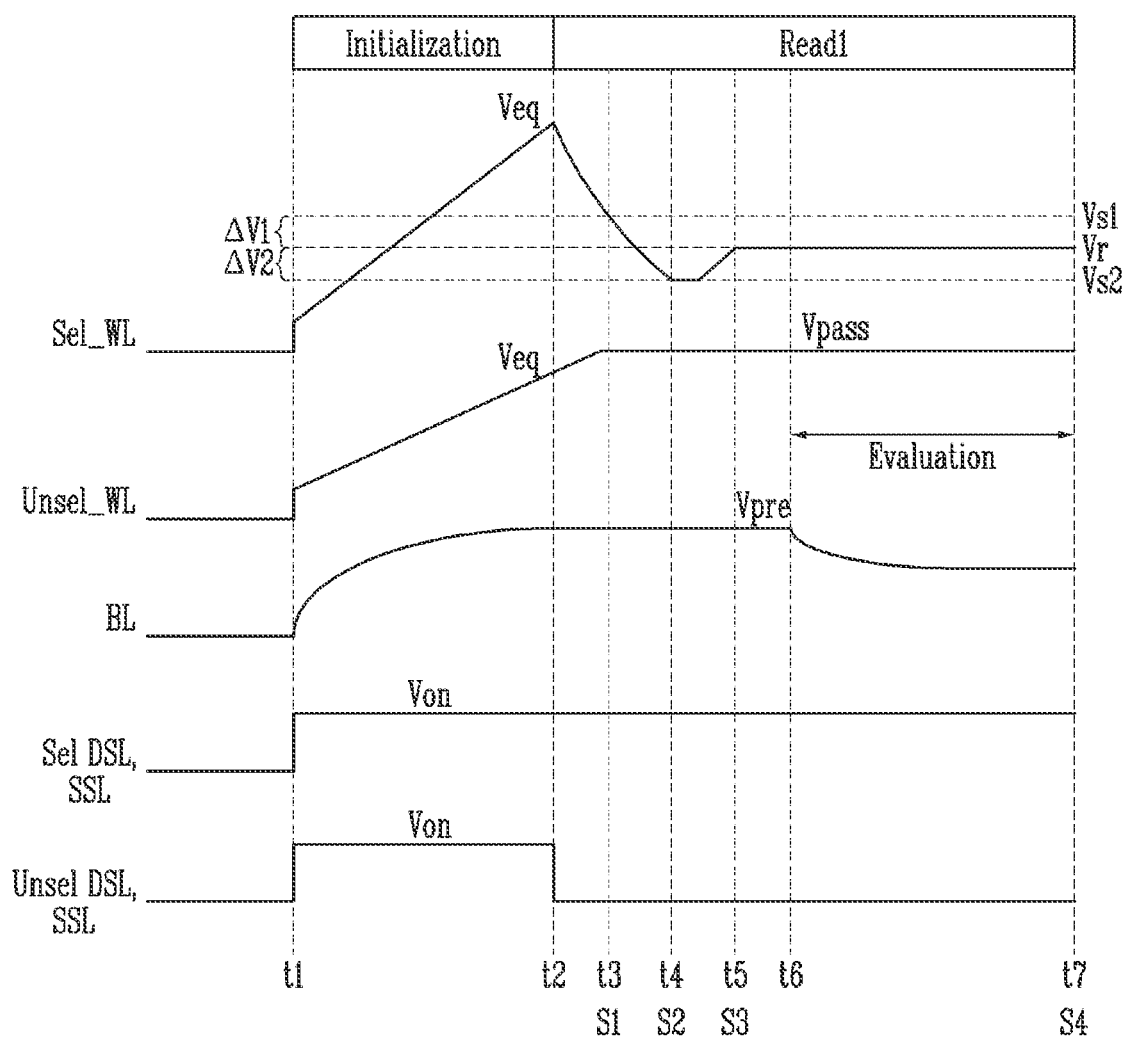
FIG. 9 is a diagram illustrating a read operation of the memory device.

In FIG. 8, the cells programmed with the threshold voltage corresponding to the first and second program states PV1 to PV2 are described as an example, but among the plurality of program states, the threshold voltage distribution of the memory cells programmed with the threshold voltage corresponding to program states adjacent to each other may be changed identically to that shown in FIG. 8 as a time elapses, FIG. 9 is a diagram illustrating the read operation of the memory device.

Referring to FIG. 9, the memory device 100 may perform the read operation. The read operation may include an initialization period Initialization and a first read period Read1.

A period t1 to t2 may be the initialization period Initialization. The initialization period Initialization may be a period for initializing a channel area of the memory cells. In the period t1 to t2, the memory device 100 may apply an equalizing voltage Veq to the plurality of word lines. The plurality of word lines may include a selected word line Sel_WL and unselected word lines Unsel_WL. In the period t1 to t2, a voltage of the plurality of word lines may increase to the equalizing voltage Veq. In the period t1 to t2, the memory device 100 may apply a precharge voltage Vpre to the bit lines connected to the memory cells. In the period t1 to t2, the voltage of the bit lines may increase to the precharge voltage Vpre. In the period t1 to t2, the memory device 100 may apply a turn-on voltage Von to a selected drain select line and a selected source select line Sel DSL and SSL. The turn-on voltage Von may be a voltage higher than a threshold voltage of a drain select transistor and a source select transistor respectively connected to the selected drain select line and the selected source select line Sel DSL and SSL. In the period t1 to t2, the memory device 100 may apply the turn-on voltage Von to an unselected drain select line and an unselected source select line Unsel DSL and SSL.

A period t2 to t7 may be the first read period Read1. The first read period Read1 may be a period for obtaining data stored in selected memory cells connected to the selected word line Sel_WL. In an embodiment, when the read operation on the CSB page is performed, the first read period Read1 may be a period for obtaining the data stored in the selected memory cells using the seventh read voltage Vr7 shown in FIG. 7. At this time, the read voltage Vr may be the seventh read voltage Vr7.

In the period t2 to t7, the memory device may apply the read voltage Vr to the selected word line Sel_WL. In the period t2 to t7, a magnitude of a voltage of the selected word line may be decreased from the equalizing voltage Veq to a voltage lower than the read voltage Vr, and may then have the same magnitude as the read voltage Vr.

The memory device 100 may apply the read voltage Vr at a time t2 and count the number of on cells of the selected memory cells when a predetermined time elapses from a time when the read voltage Vr is applied. A time point when the predetermined time elapses may be a time point t3, a time point t4, and a time point t5.

In a period t2 to t3, the voltage of the selected word line may be decreased from the equalizing voltage Veq to a first search voltage Vs1. The memory device 100 may perform a first sensing operation S1 at the time point t3 when the voltage of the selected word line is decreased to the first search voltage Vs1. A sensing operation may be an operation of sensing the voltage of the bit line that is changed based on the threshold voltage of the selected memory cells. The data stored in the selected memory cells may be identified according to a sensed voltage magnitude of the bit line. In an embodiment, the first sensing operation S1 may be an operation of sensing the voltage of the bit line that is changed when the magnitude of the voltage of the selected word line Sel_WL is the first search voltage Vs1. Specifically, a voltage of a bit line connected to a memory cell having a threshold voltage higher than the first search voltage Vs1 among the selected memory cells may be maintained as the precharge voltage Vpre. Data stored in a memory cell having a threshold voltage higher than the first search voltage Vs1 may be identified as data corresponding to the off cell. In addition, a voltage of a bit line connected to a memory cell having a threshold voltage lower than the first search voltage Vs1 among the selected memory cells may be lower than the precharge voltage Vpre. Data stored in a memory cell having a threshold voltage lower than the first search voltage Vs1 may be identified as data corresponding to the on cell.

The memory device 100 may count the first number of on cells identified by the first search voltage Vs1 among the selected memory cells at the time point t3. The first number of on cells may be the number of memory cells having the threshold voltage lower than the first search voltage Vs1 among the selected memory cells.

The memory device 100 may perform the first sensing operation S1 and precharge the voltage of the bit lines connected to the selected memory cells to the precharge voltage Vpre again before performing a second sensing operation S2. Specifically, the voltage of the bit line connected to the memory cell having the threshold voltage lower than the first search voltage Vs1 may be lower than the precharge voltage Vpre after performing the first sensing operation S1, and may increase to the precharge voltage Vpre again before performing the second sensing operation S2. However, in a case of FIG. 9 and FIG. 13 to be described later, a change in the magnitude of the voltage of the bit line in the first sensing operation S1, the second sensing operation S2, and a third sensing operation S3 is omitted, and for convenience of description, it is shown that the magnitude of the voltage of the bit line is constant. That is, as described above, the voltage of the bit line, which is lower than the precharge voltage Vpre in any one sensing operation, may increase to the precharge voltage Vpre again before a next sensing operation.

In a period t3 to t4, the voltage of the selected word line may be decreased from the first search voltage Vs1 to a second search voltage Vs2. The memory device 100 may perform the second sensing operation S2 at the time point t4 when the voltage of the selected word line is decreased to the second search voltage Vs2. The second sensing operation S2 may be an operation of sensing the voltage of the bit line that is changed when the magnitude of the voltage of the selected word line Sel_WL is the second search voltage Vs2. Specifically, the memory device 100 may count the second number of on cells identified by the second search voltage Vs2 among the selected memory cells at the time point t4. The second number of on cells may be the number of memory cells having a threshold voltage lower than the second search voltage Vs2 among the selected memory cells. A voltage of a bit line connected to the memory cell having the threshold voltage lower than the second search voltage Vs2 may be lower than the precharge voltage Vpre after performing the second sensing operation S2, and may increase to the precharge voltage Vpre before performing the third sensing operation S3.

In a period t4 to t5, the voltage of the selected word line may increase from the second search voltage Vs2 to the read voltage Vr. The memory device 100 may perform the third sensing operation S3 at the time point t5 when the voltage of the selected word line is increased to the read voltage Vr. The third sensing operation S3 may be an operation of sensing the voltage of the bit line that is changed when the magnitude of the voltage of the selected word line is the read voltage Vr, Specifically, the memory device 100 may count the third number of on cells identified by the read voltage Vr among the selected memory cells at the time point t5. The third number of on cells may be the number of memory cells having a threshold voltage lower than the read voltage Vr among the selected memory cells. A voltage of a bit line connected to the memory cell having the threshold voltage lower than the read voltage Vr may be lower than the precharge voltage Vpre after performing the third sensing operation S3, and may increase to the precharge voltage Vpre again before performing a fourth sensing operation S4.

In a period t5 to t6, the magnitude of the voltage of the selected word line Sel_WL may be maintained as a magnitude of the read voltage Vr.

In an embodiment, the memory device 100 may perform the sensing operation at each of a time point when the magnitude of the voltage of the selected word line Sel_WL reaches the first search voltage Vs1, the second search voltage Vs2, and the read voltage Vr in a process in which the magnitude of the voltage of the selected word line Sel . . . . WL is decreased from the equalizing voltage Veq to the read voltage Vr. The memory device 100 may count the number of on cells identified by each of the first search voltage Vs1, the second search voltage Vs2, and the read voltage Vr among the selected memory cells. In an embodiment, the memory device 100 may perform the sensing operation on only some memory cells among the selected memory cells at the time point when the magnitude of the voltage reaches the first search voltage Vs1, the second search voltage Vs2, and the read voltage Vr. For example, when the selected memory cells are configured in 16 KB unit, the memory device 100 may perform the sensing operation on only 8 KB which is a portion of 16 KB. As another example, when the selected memory cells are configured in 16 KB unit, the memory device 100 may perform the sensing operation on only 4 KB which is a portion of 16 KB.

In an embodiment, a magnitude difference $\Delta V1$ between the first search voltage and the read voltage may be the same as a magnitude difference $\Delta V2$ between the read voltage and the second search voltage.

In a period t2 to t7, the memory device 100 may apply the pass voltage Vpass to the unselected word lines Unsel_WL. In the period t2 to t7, a magnitude of a voltage of the unselected word lines Unsel_WL may increase from the equalizing voltage Veq to the pass voltage Vpass.

In a period t2 to t6, the magnitude of the voltage of the bit line may be maintained as the magnitude of the precharge voltage.

In the period t2 to t7, the memory device 100 may apply the turn-on voltage Von to the selected drain select line and the selected source select line Sel DSL and SSL. In the period t2 to t7, the memory device 100 may apply a ground voltage to the unselected drain select line and the unselected source select line Unset_DSL and SSL.

The period t6 to t7 may be an evaluation period Evaluation. The evaluation period Evaluation may be a period for sensing the voltage of the bit line that is changed according to the magnitude of the threshold voltage of the selected memory cells. The memory device 100 may perform the fourth sensing operation S4 after the evaluation period Evaluation in which the voltage of the bit line is changed to a voltage lower than the precharge voltage Vpre elapses. The fourth sensing operation S4 may be an operation of obtaining the data stored in the selected memory cells based on a result of comparing a reference voltage with the voltage of the bit line changed after the evaluation period elapses.

In an embodiment, a length of the evaluation period may be changed. The memory device 100 determines the length of the evaluation period based on a result of comparing the number of on cells identified by the first sensing operation S1, the second sensing operation S2, and the third sensing operation S3. A method of determining the length of the evaluation period is described later with reference to FIGS. 10 to 12.

Figure 10:
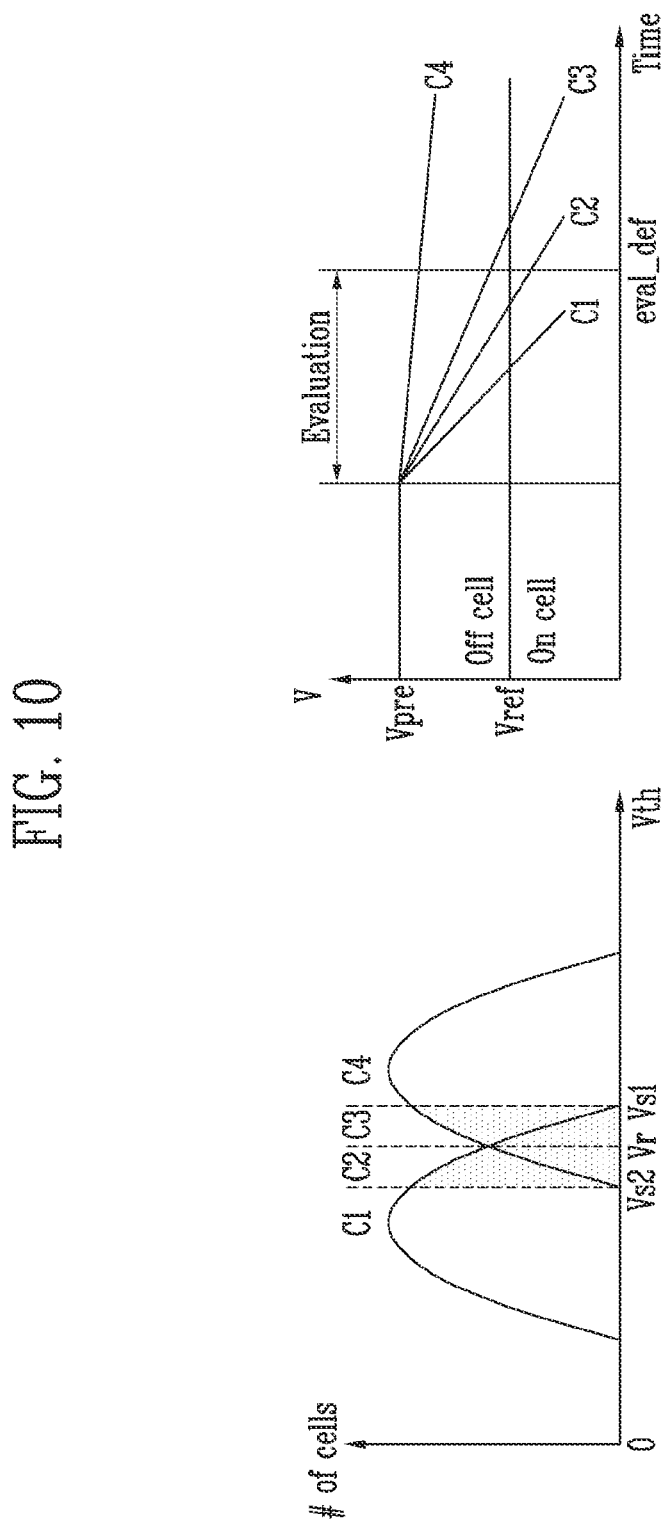
FIG. 10 is a diagram illustrating an evaluation period determined according to the read operation of the memory device.

FIG. 10 is a diagram illustrating the evaluation period determined according to the read operation of the memory device.

The threshold voltage distribution of the memory cells shown in FIG. 10 indicates program states adjacent to each other among a plurality of program states. In FIG. 10, a horizontal axis of a graph shown on a left side indicates the threshold voltage Vth of the memory cells, and a vertical axis of the graph shown on the left side indicates the number of memory cells # of cells. In FIG. 10, a horizontal axis of a graph shown on a right side indicates a time Time, and a vertical axis of the graph shown on the right side indicates a voltage V.

Referring to the graph shown on the left side of FIG. 10, memory cells of a first section C1 may be memory cells having a threshold voltage less than the second search voltage Vs2. Memory cells of a second section C2 may be memory cells having a threshold voltage greater than the second search voltage Vs2 and less than the read voltage Vr. Memory cells of a third section C3 may be memory cells having a threshold voltage greater than the read voltage Vr and less than the first search voltage Vs1. Memory cells of a fourth section C4 may be memory cells having a threshold voltage greater than the first search voltage Vs1.

The memory device 100 may count the number of on cells identified by the first search voltage Vs1, the second search voltage Vs2, and the read voltage Vr among the selected memory cells. The memory device 100 may compare the number of on cells each identified by the first search voltage Vs1, the second search voltage Vs2, and the read voltage Vr.

The memory device 100 may count the first number of valley cells which is a difference between the first number of on cells identified by the first search voltage Vs1 and the third number of on cells identified by the read voltage Vr. The first number of valley cells may be the number of memory cells of the third section C3. The memory device 100 may count the second number of valley cells which is a difference between the third number of on cells identified by the read voltage Vr and the second number of on cells identified by the second search voltage Vs2. The second number of valley cells may be the number of memory cells of the second section C2.

Referring to the graph shown on the right side of FIG. in the evaluation period Evaluation, the magnitude of the voltage of the bit line may be decreased to a voltage lower than the precharge voltage. Specifically, a degree to which the magnitude of the voltage of the bit line is decreased in the evaluation period Evaluation may vary according to a magnitude of the threshold voltage of the memory cell connected to the bit line. For example, the magnitude of the voltage of the bit line connected to the memory cell of the first section C1 may be decreased with the greatest slope. The magnitude of the voltage of the bit line connected to the memory cell of the second section C2 may be decreased with a slope lower than the slope of the bit line connected to the memory cell of the first section C1. The magnitude of the voltage of the bit line connected to the memory cell of the third section C3 may be decreased with a slope lower than the slope of the bit line connected to the memory cell of the second section C2. The magnitude of the voltage of the bit line connected to the memory cell of the fourth section C4 may be decreased with the lowest slope.

The memory device 100 may sense the voltage of the bit line after the evaluation period Evaluation, which is an interval to a time point when a predetermined time elapses from a time when the voltage of the bit line is decreased to the voltage lower than the precharge voltage. Specifically, the memory device 100 may obtain the data stored in the memory cell connected to the bit line based on a result of comparing the voltage of the bit line with a reference voltage Vref at a reference evaluation time point eval_def. When the voltage of the bit line is greater than the reference voltage Vref at the reference evaluation time point eval_def, the memory device 100 may identify that the memory cell connected to the bit line is the off cell Off cell. For example, the memory device 100 may obtain data having a logic value of 0 from the memory cell identified as the off cell Off cell. When the voltage of the bit line is less than the reference voltage Vref at the reference evaluation time point eval_def, the memory device 100 may identify that the memory cell connected to the bit line is the on cell On cell. For example, the memory device 100 may obtain data having a logic value of 1 from the memory cell identified as the on cell On cell.

Because the voltage of the bit line connected to the memory cell of the first section C1 is less than the reference voltage Vref at the reference evaluation time point eval_def, the memory cell of the first section C1 may be identified as the on cell On cell. Because the voltage of the bit line connected to the memory cell of the second section C2 is less than the reference voltage Vref at the reference evaluation time point eval_def, the memory cell of the second section C2 may be identified as the on cell On cell. Because the voltage of the bit line connected to the memory cell of the third section C3 is greater than the reference voltage Vref at the reference evaluation time point eval_def, the memory cell of the third section C3 may be identified as the off cell Off cell. Because the voltage of the bit line connected to the memory cell of the fourth section C4 is greater than the reference voltage Vref at the reference evaluation time point eval_def, the memory cell of the fourth section C4 may be identified as the off cell Off cell.

In an embodiment, the memory device 100 may determine the length of the evaluation period based on a result of comparing the first number of valley cells with the second number of valley cells. Specifically, when the difference between the first number of valley cells and the second number of valley cells is less than the reference number of cells, the memory device may determine the length of the evaluation period as a first evaluation period Evaluation. The first evaluation period Evaluation may be a period from a time when the voltage of the bit line is decreased to the reference evaluation time point eval_def. The memory device 100 may sense the voltage of the bit line after the first evaluation period Evaluation elapses.

That is, when the difference between the first number of valley cells and the second number of valley cells is not large, the memory device 100 may determine that the read voltage Vr is an optimal read voltage for distinguishing program states adjacent to each other.

Figure 11:
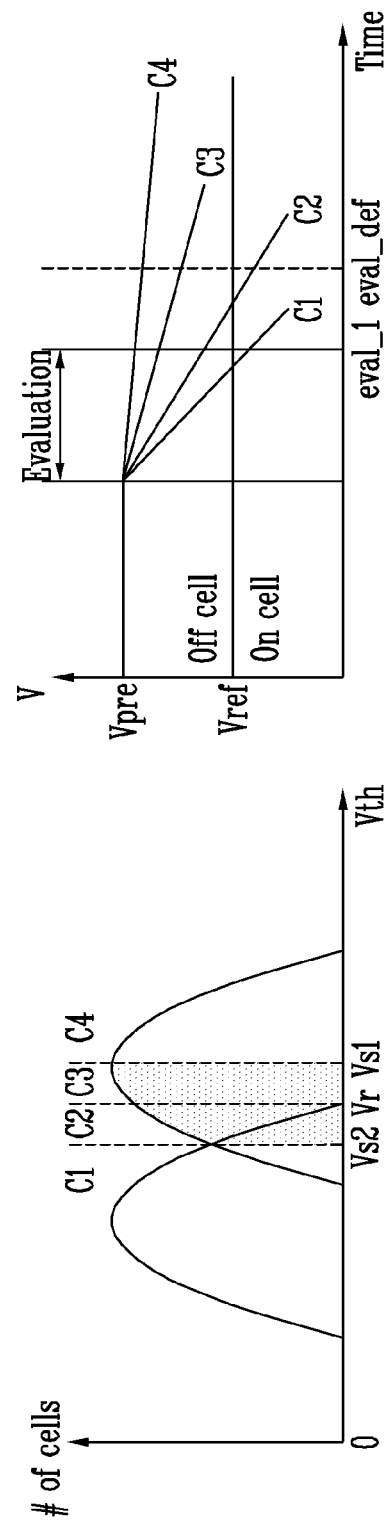
FIG. 11 is a diagram illustrating another embodiment of the evaluation period determined according to the read operation of the memory device.

FIG. 11 is a diagram illustrating another embodiment of the evaluation period determined according to the read operation of the memory device.

In FIG. 11, a horizontal axis of a graph shown on a left side indicates the threshold voltage Vth of the memory cells, and a vertical axis of the graph shown on the left side indicates the number of memory cells # of cells. In FIG. 11, a horizontal axis of a graph shown on a right side indicates a time Time, and a vertical axis of the graph shown on the right side indicates a voltage V. In the description referring to FIG. 11, content redundant with that of FIG. 10 is omitted.

Referring to FIG. 11, the memory device 100 may determine the length of the evaluation period based on a result of comparing the first number of valley cells and the second number of valley cells. The first number of valley cells may be the number of memory cells of the third section C3. The second number of valley cells may be the number of memory cells of the second section C2. The memory device 100 may change the length of the evaluation period when a difference between the first number of valley cells and the second number of valley cells is greater than the reference number of cells. That is, when the first number of valley cells is greater than the second number of valley cells and the difference between the first number of valley cells and the second number of valley cells is large, the memory device 100 may determine that the read voltage Vr is not the optimal read voltage that distinguishes program states adjacent to each other. In this case, the optimal read voltage that distinguishes program states adjacent to each other may be the second search voltage Vs2.

Referring to the graph on the right side of FIG. 11, the voltage of the bit line connected to the memory cell of the second section C2 may be less than the reference voltage Vref at the reference evaluation time point eval_def. That is, when the voltage of the bit line connected to the memory cell of the second section C2 is sensed at the reference evaluation time point eval_def, the memory cell of the second section C2 may be identified as the on cell On cell. However, at a first evaluation time point eva_1 the voltage of the bit line connected to the memory cell of the second section C2 may be greater than the reference voltage Vref. That is, when the voltage of the bit line connected to the memory cell of the second section C2 is sensed at the first evaluation time point eval_1 which is a time point earlier than the reference evaluation time point eval_def, the memory cell of the second section C2 may be identified as the off cell Off cell.

That is, when the difference between the first number of valley cells and the second number of valley cells is greater than the reference number of cells, the memory device 100 may determine the length of the evaluation period to a second evaluation period Evaluation shorter than the first evaluation period described with reference to FIG. 10. The second evaluation period Evaluation may be a period from a time when the voltage of the bit line is decreased to the first evaluation time point eval_1. The memory device 100 may obtain the same effect as obtaining the data stored in the memory cells using the second search voltage Vs2 by sensing the voltage of the bit line after the second evaluation period Evaluation elapses.

Figure 12:
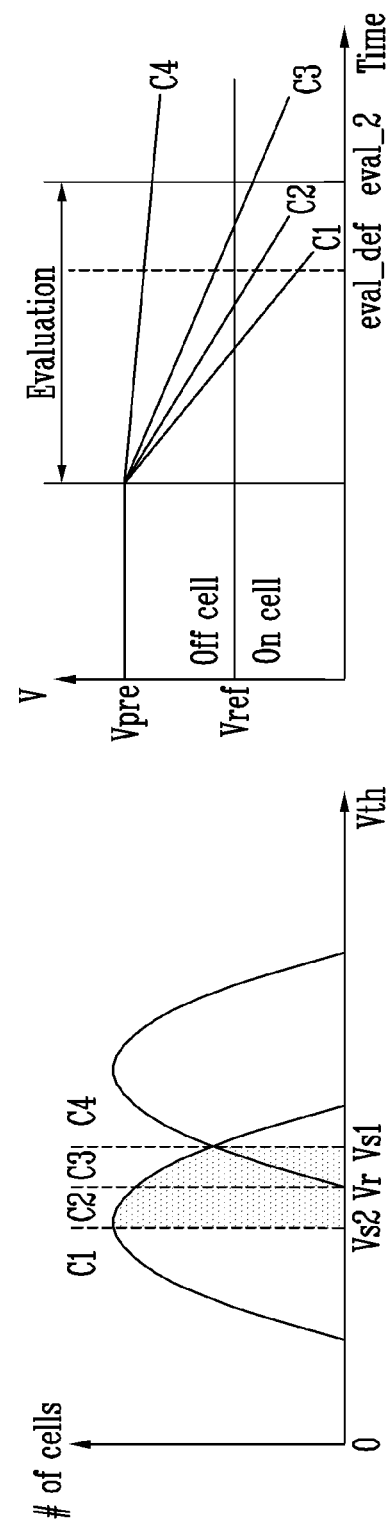
FIG. 12 is a diagram illustrating still another embodiment of the evaluation period determined according to the read operation of the memory device.

FIG. 12 is a diagram illustrating still another embodiment of the evaluation period determined according to the read operation of the memory device.

In FIG. 12, a horizontal axis of a graph shown on a left side indicates the threshold voltage Vth of the memory cells, and a vertical axis of the graph shown on the left side indicates the number of memory cells # of cells. In FIG. 12, a horizontal axis of a graph shown on a right side indicates a time Time, and a vertical axis of the graph shown on the right side indicates a voltage V. In the description referring to FIG. 12, content redundant with that of FIGS. 10 and 11 is omitted.

Referring to FIG. 12, the memory device 100 may determine the length of the evaluation period based on a result of comparing the first number of valley cells and the second number of valley cells. The first number of valley cells may be the number of memory cells of the third section C3. The second number of valley cells may be the number of memory cells of the second section C2. The memory device 100 may change the length of the evaluation period when a difference between the second number of valley cells and the first number of valley cells is greater than the reference number of cells. That is, when the second number of valley cells is greater than the first number of valley cells and the difference between the first number of valley cells and the second number of valley cells is large, the memory device 100 may determine that the read voltage Vr is not the optimal read voltage that distinguishes program states adjacent to each other. In this case, the optimal read voltage that distinguishes program states adjacent to each other may be the first search voltage Vs1.

Referring to the graph on the right side of FIG. 12, the voltage of the bit line connected to the memory cell of the third section C3 may be greater than the reference voltage Vref at the reference evaluation time point eval_def. That is, when the voltage of the bit line connected to the memory cell of the third section C3 is sensed at the reference evaluation time point eval_def, the memory cell of the third section C3 may be identified as the off cell Off cell. However, at a second evaluation time point eval_2, the voltage of the bit line connected to the memory cell of the third section C3 may be less than the reference voltage Vref. That is, when the voltage of the bit line connected to the memory cell of the third section C3 is sensed at the second evaluation time point eval_2 which is a time point later than the reference evaluation time point eval_def, the memory cell of the third section C3 may be identified as the on cell On cell.

That is, when the difference between the second number of valley cells and the first number of valley cells is greater than the reference number of cells, the memory device may determine the length of the evaluation period to a third evaluation period Evaluation longer than the first evaluation period described with reference to FIG. 10. The third evaluation period Evaluation may be a period from a time when the voltage of the bit line is decreased to the second evaluation time point. The memory device 100 may obtain the same effect as obtaining the data stored in the memory cells using the first search voltage Vs1 by sensing the voltage of the bit line after the third evaluation period Evaluation elapses, FIG. 13 is a diagram illustrating another embodiment of the read operation of the memory device.

Figure 13:
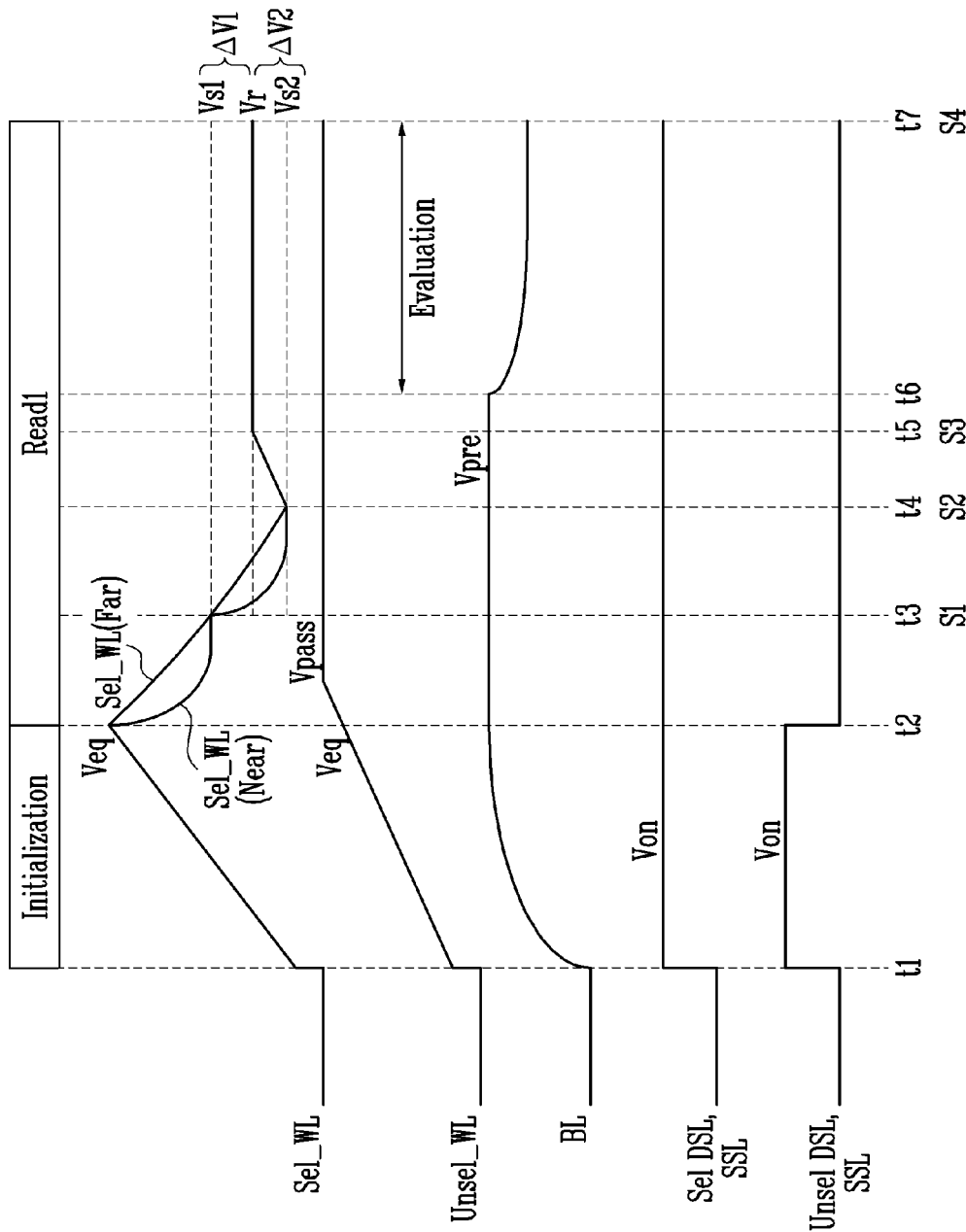
FIG. 13 is a diagram illustrating another embodiment of the read operation of the memory device.

In the description referring to FIG. 13, content redundant with that of FIG. 9 is omitted. Referring to FIG. 13, the read operation of the memory device may include the initialization period Initialization and the first read period Read1.

In a period t1 to t2, the memory device 100 may apply the equalizing voltage Veq to the selected word line Sel_WL.

In a period t2 to t4, the magnitude of the voltage of the selected word line may be decreased from the equalizing voltage Veq to the first search voltage Vs1 and then decreased to the second search voltage Vs2. In an embodiment, the selected word line Sel_WL may be a word line Sel_WL(Near) of which a physical distance is close to the address decoder or a word line Sel_WL(Far) of which the physical distance is far from the address decoder. For example, referring to FIG. 5, when the selected word line Sel_WL is the first word line WL1, the word line Sel_WL(Near) of which the physical distance is close to the address decoder may be a word line connected to an 11-th memory cell string CS11' and a 1m-th memory cell string CS1m' among the first word lines. The word line Sel_WL(Far) of which the physical distance is far from the address decoder may be a word line connected to a 21-st memory cell string CS21' and a 2m-th memory cell string CS2m' among the first word lines.

In the period t2 to t4, a degree to which a magnitude of a voltage of the word line (Sel_WL(Near)) of which the physical distance is close to the address decoder decreases and a magnitude of a voltage of the word line (Sel_WL(Far)) of which the physical distance is far from the address decoder decreases may be different.

Specifically, in a period t2 to t3, the memory device 100 may apply the first search voltage Vs1 less than the equalizing voltage Veq to the selected word line Sel_WL. In the period t2 to t3, the magnitude of the voltage of the word line Sel_WL(Near) of which the physical distance is close to the address decoder may be maintained as a magnitude of the first search voltage Vs1 during a predetermined time. The memory device 100 may perform the first sensing operation S1 at the time point t3 when the magnitude of the voltage of the selected word line is decreased from the equalizing voltage Veq to the first search voltage Vs1. The memory device 100 may count the first number of on cells identified by the first search voltage Vs1 among the selected memory cells at the time point t3.

In a period t3 to t4, the memory device 100 may apply the second search voltage Vs2 less than the first search voltage Vs1 to the selected word line Sel_WL. In the period t3 to t4, the magnitude of the voltage of the word line Sel_WL(Near) of which the physical distance is close to the address decoder may be maintained as a magnitude of the second search voltage Vs2 during a predetermined time.

The memory device 100 may perform the second sensing operation S2 at the time point t4 when the magnitude of the voltage of the selected word line Se WL is decreased from the first search voltage Vs1 to the second search voltage Vs2. The memory device 100 may count the second number of on cells identified by the second search voltage Vs2 among the selected memory cells at the time point t4.

In a period t2 to t4, the magnitude of the voltage of the word line Sel_WL(Far) of which the physical distance is far from the address decoder may be sequentially decreased from the equalizing voltage Veq to the second search voltage Vs2.

In a period t4 to t5, the memory device 100 may apply the read voltage Vr greater than the second search voltage Vs2 to the selected word line Sel_WL. The memory device may perform the third sensing operation S3 at the time point t5 when the magnitude of the voltage of the selected word line increases from the second search voltage Vs2 to the read voltage Vr. The memory device 100 may count the third number of on cells identified by the read voltage Vr among the selected memory cells at the time point t5.

In an embodiment, the memory device 100 may apply the equalizing voltage Veq to the selected word line, perform the first sensing operation S1 after applying the first search voltage Vs1, perform the second sensing operation S2 after applying the second search voltage Vs2, and perform the third sensing operation S3 after applying the read voltage Vr. In an embodiment, the memory device 100 may perform the sensing operation only on the selected memory cells connected to the word line Sel_WL(Near) of which the physical distance is close to the address decoder among the selected word lines, thereby preventing a time for performing the read operation from being lengthened. In addition, the memory device 100 may perform the sensing operation on the selected memory cells in a state in which the magnitude of the voltage of the word line Sel_WL(Near) of which the physical distance is close to the address decoder is stabilized to each of the first search voltage Vs1, the second search voltage Vs2, and the read voltage Vr.

In an embodiment, the difference ΔV1 between the first search voltage and the read voltage may be the same as the difference ΔV2 between the read voltage and the second search voltage.

A period t6 to t7 may be the evaluation period Evaluation. The memory device 100 may perform the fourth sensing operation S4 after the evaluation period Evaluation in which the voltage of the bit line is changed to a voltage lower than the precharge voltage elapses. The memory device 100 may determine the length of the evaluation period based on a result of comparing the number of on cells each identified by the first sensing operation S1, the second sensing operation S2, and the third sensing operation S3.

In an embodiment, the memory device 100 may determine the length of the evaluation period as a first period when the difference between the first number of valley cells, which is the difference between the first number of on cells identified by the first search voltage Vs1 and the second number of on cells identified by the read voltage Vr, and the second number of valley cells, which is the difference between the second number of on cells and the third number of on cells identified by the second search voltage Vs2, is less than the reference number of cells.

In an embodiment, when the difference between the first number of valley cells and the second number of valley cells is greater than the reference number of cells, the memory device 100 may determine the length of the evaluation period as a second period shorter than the first period.

In an embodiment, when the difference between the second number of valley cells and the first number of valley cells is greater than the reference number of cells, the memory device 100 may determine the length of the evaluation period as a third period longer than the first period.

In an embodiment, when the number of times the program and erase operations are performed on the memory cells is greater than a preset number of times, the memory device 100 may determine the length of the evaluation period based on the number of on cells each identified by the first search voltage Vs1, the second search voltage Vs2, and the read voltage Vr.

Figure 14:
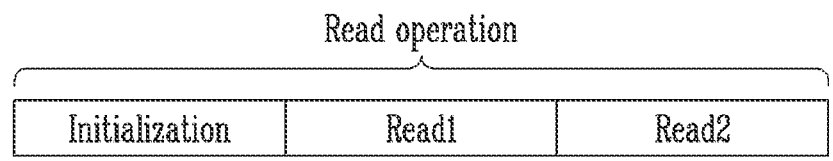
FIG. 14 is a diagram illustrating a read operation of a memory device using a plurality of read voltages.

FIG. 14 is a diagram illustrating a read operation of a memory device using a plurality of read voltages.

Referring to FIG. 14, a read operation may include an initialization period Initialization, a first read period Read1, and a second read period Read2. The initialization period Initialization and the first read period Read1 may be the same as the initialization period Initialization and the first read period Read1 described with reference to FIG. 9. The second read period Read2 may be a period in which the data stored in the memory cells is obtained using a read voltage different from the read voltage used in the first read period Read1. For example, referring to FIG. 7, when the read operation on the CSB page is performed, the read voltage used in the first read period Read1 may be the seventh read voltage Vr7 and the read voltage used in the second read period Read2 may be the third read voltage Vr3 less than the seventh read voltage Vr7.

In an embodiment, in the second read period Read2, the memory device 100 may obtain the data stored in the memory cells by comparing the voltage of the bit line with the reference voltage after an evaluation period equal to the length of the evaluation period determined in the first read period Read1 elapses.

In an embodiment, in the second read period Read2, the memory device 100 may determine a length of the evaluation period included in the second read period based on a result of comparing the number of on cells each identified by a third search voltage greater than the read voltage used in the second read period Read2, a fourth search voltage less than the read voltage, and the read voltage used in the second read period Read2 in a process in which the magnitude of the voltage of the selected word line is decreased to the read voltage used in the second read period Read2. A difference between a magnitude of the third search voltage and a magnitude of the read voltage used in the second read period Read2 may be the same as a difference between the magnitude of the read voltage used in the second read period Read2 and a magnitude of the fourth search voltage.

In an embodiment, the read operation may further include a third read period following the second read period Read2. The third read period may be a period in which the data stored in the memory cells is obtained using a read voltage different from the read voltage used in the first read period Read1 and the second read period Read2. In the third read period, the memory device 100 may determine the length of the evaluation period identically to the first read period Read1 or the second read period Read2.

FIG. 15 is a flowchart illustrating the read operation of the memory device.

Referring to FIG. 15, in step S1501, the memory device 100 may initialize the channel area of the memory cells using the equalizing voltage.

In step S1503, the memory device 100 may count the number of on cells each identified by the first search voltage, the second search voltage, and the read voltage among the memory cells. The magnitude of the first search voltage may be greater than the read voltage. The magnitude of the second search voltage may be less than the read voltage.

In step S1505, the memory device 100 may determine the length of the evaluation period in which the voltage of the bit lines connected to the memory cells is sensed based on a result of comparing the number of on cells each identified by the first search voltage, the second search voltage, and the read voltage. The memory device 100 may determine the length of the evaluation period differently according to whether the difference between the first number of valley cells, which is the difference between the first number of on cells identified by the first search voltage and the second number of on cells identified by the read voltage, and the second number of valley cells, which is the difference between the second number of on cells and the third number of on cells identified by the second search voltage, is less than the reference number of cells.

In step S1507, the memory device 100 may obtain the data stored in the memory cells during the evaluation period. The memory device 100 may obtain the data stored in the memory cells based on a result of comparing the voltage of the bit lines connected to the memory cells with the reference voltage,

What is claimed is:

1. A memory device comprising:
memory cells connected to a plurality of word lines;
a read operation performer configured to perform a read operation of applying an equalizing voltage to the plurality of word lines and applying a read voltage to a selected word line among the plurality of word lines;
a fail cell counter configured to count a number of on cells among selected memory cells connected to the selected word line at each of a first time point when a predetermined time elapses from a time when the read voltage is applied, a second time point when a predetermined time elapses from the first time point, and a third time point when a voltage of the selected word line reaches the read voltage; and
a read operation controller configured to control the read operation performer to determine a length of an evaluation period based on a result of comparing the number of on cells at the first time point, the second time point, and the third time point, and configured to sense a voltage of bit lines respectively connected to the selected memory cells after the evaluation period elapses from the time when the voltage of the selected word line reaches the read voltage during the read operation.

2. The memory device of claim 1, wherein the read operation controller is configured to control the read operation performer to obtain data stored in the selected memory cells based on a result of comparing the voltage of the bit lines with a reference voltage after the evaluation period elapses.

3. The memory device of claim 2, wherein a voltage magnitude of the selected word line at the second time point is less than the read voltage.

4. The memory device of claim 3, wherein the read operation controller is configured to determine the length of the evaluation period as a first period when a difference between the first number of valley cells, which is a difference between the first number of on cells identified at the first time point and the second number of on cells identified at the third time point, and the second number of valley cells, which is a difference between the second number of on cells and the third number of on cells identified at the second time point, is less than the reference number of cells.

5. The memory device of claim 4, wherein the read operation controller is configured to determine the length of the evaluation period as a second period shorter than the first period when a difference between the first number of valley cells and the second number of valley cells is greater than the reference number of cells.

6. The memory device of claim 4, wherein the read operation controller is configured to determine the length of the evaluation period as a third period longer than the first period when the difference between the second number of valley cells and the first number of valley cells is greater than the reference number of cells.

7. The memory device of claim 2, wherein the read operation controller is configured to control the read operation performer to obtain the data stored in the selected memory cells after the evaluation period elapses during a subsequent read operation following the read operation.

8. The memory device of claim 1, wherein a difference between a magnitude of a voltage of the selected word line and a magnitude of the read voltage at the first time point is the same as a difference between the magnitude of the read voltage and the magnitude of the voltage of the selected word line at the second time point.

9. The memory device of claim 1, wherein the read operation controller is configured to control the read operation performer to sense the voltage of the bit lines after the evaluation period determined according to the result of comparing the number of on cells elapses when the number of times program and erase operations performed on the selected memory cells is greater than a preset number.

10. The memory device of claim 1, wherein the selected memory cells are memory cells for which a physical distance is closer to an address decoder providing the read voltage to the selected word line than remaining memory cells except for the selected memory cells among the memory cells.

11. A method of operating a memory device, the method comprising:
performing a read operation of applying an equalizing voltage to a plurality of word lines and applying a read voltage to a selected word line among the plurality of word lines;
counting a number of on cells among selected memory cells connected to the selected word line at each of a first time point when a voltage of the selected word line reaches a first search voltage lower than the equalizing voltage, a second time point when the voltage of the selected word line reaches a second search voltage lower than the first search voltage, and a third time point when the voltage of the selected word line reaches the read voltage higher than the second search voltage; and determining a length of an evaluation period based on a result of comparing the number of on cells at the first time point, the second time point, and the third time point, and sensing a voltage of bit lines respectively connected to the selected memory cells after the evaluation period elapses from the time when the voltage of the selected word line reaches the read voltage.

12. The method of claim 11, wherein sensing the voltage of the bit lines comprises obtaining data stored in the selected memory cells based on a result of comparing the voltage of the bit lines with a reference voltage.

13. The method of claim 12, wherein the length of the evaluation period is determined as a first period when a difference between a first number of valley cells, which is a difference between a first number of on cells identified by the first search voltage and a second number of on cells identified by the read voltage, and a second number of valley cells, which is a difference between the second number of on cells and a third number of on cells identified by the second search voltage, is less than the reference number of cells.

14. The method of claim 13, wherein determining the length of the evaluation period comprises determining the length of the evaluation period as a second period shorter than the first period when the difference between the first number of valley cells and the second number of valley cells is greater than the reference number of cells.

15. The method of claim 13, wherein determining the length of the evaluation section comprises determining the length of the evaluation period as a third period longer than the first period when the difference between the second number of valley cells and the first number of valley cells is greater than the reference number of cells.

16. The method of claim 12, wherein the data stored in the selected memory cells is obtained after the evaluation period elapses during a subsequent read operation following the read operation.

17. The method of claim 11, wherein a difference between a magnitude of the first search voltage and a magnitude of the read voltage is the same as a difference between the magnitude of the read voltage and the magnitude of the second search voltage.

18. A memory device comprising:

memory cells connected to a plurality of word lines;

a read operation performer configured to perform a read operation of applying an equalizing voltage to the plurality of word lines, applying a first search voltage less than the equalizing voltage, a second search voltage less than the first search voltage, and a read voltage greater than the second search voltage to a selected word line among the plurality of word lines;

a fail cell counter configured to count a number of on cells each identified by the first search voltage, the second search voltage, and the read voltage among selected memory cells connected to the selected word line; and a read operation controller configured to control the read operation performer to sense a voltage of bit lines respectively connected to the selected memory cells after an evaluation period determined according to a result of comparing the number of each identified on cells elapses from a time when a voltage of the selected word line reaches the read voltage during the read operation.

19. The memory device of claim 18, wherein the read operation controller is configured to determine a length of the evaluation period according to a result of comparing a difference between a first number of valley cells, which is a difference between a first number of on cells identified by the first search voltage and a second number of on cells identified by the read voltage, and a second number of valley cells, which is a difference between the second number of on cells and a third number of on cells identified by the second search voltage, with the reference number of cells.

20. The memory device of claim 19, wherein the read operation controller is configured to control the read operation performer to obtain data stored in the selected memory cells based on a result of comparing the voltage of the bit lines with a reference voltage after the evaluation period elapses.

* * * * *